US012604553B2

(12) United States Patent
Jeon et al.

(10) Patent No.: US 12,604,553 B2
(45) Date of Patent: Apr. 14, 2026

(54) IMAGE SENSORS INCLUDING PIXEL ISOLATION STRUCTURE INCLUDING DOUBLE TRENCH

(71) Applicant: Samsung Electronics Co., Ltd., Suwon-si (KR)

(72) Inventors: Jaehoon Jeon, Hwaseong-si (KR); Kangmook Lim, Sejong-si (KR); Jeyeoun Jung, Suwon-si (KR); Jihye Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 854 days.

(21) Appl. No.: 17/696,936

(22) Filed: Mar. 17, 2022

(65) Prior Publication Data

US 2022/0415936 A1 Dec. 29, 2022

(30) Foreign Application Priority Data

Jun. 29, 2021 (KR) ......................... 10-2021-0084745

(51) Int. Cl.
H10F 39/00 (2025.01)
H10F 39/18 (2025.01)

(52) U.S. Cl.
CPC ......... H10F 39/807 (2025.01); H10F 39/014 (2025.01); H10F 39/024 (2025.01); H10F 39/182 (2025.01); H10F 39/8053 (2025.01); H10F 39/8063 (2025.01)

(58) Field of Classification Search
CPC .................................................. H10F 39/807
See application file for complete search history.

(56) References Cited

U.S. PATENT DOCUMENTS

| 9,312,301 B2 | 4/2016 | Takeda |
| 9,373,656 B2 | 6/2016 | Park |
| 9,741,759 B2 * | 8/2017 | Park ........................ H01L 24/08 |

(Continued)

FOREIGN PATENT DOCUMENTS

| JP | 2011054741 A | 3/2011 |
| KR | 10-2019-0139035 A | 12/2019 |
| KR | 10-2020-0105197 A | 9/2020 |

OTHER PUBLICATIONS

Korean Request for the Submission of an Opinion dated May 9, 2025, in connection with Korean Application No. 10-2021-0084745, with English translation thereof.

*Primary Examiner* — Ali Naraghi
(74) *Attorney, Agent, or Firm* — Wolf, Greenfield & Sacks, P.C.

(57) ABSTRACT

Image sensors may include a semiconductor substrate including a first surface and a second surface opposite the first surface and including a plurality of pixels, a first pixel isolation structure including a first trench recessed from the first surface of the semiconductor substrate into the semiconductor substrate and a conductive layer in the first trench, and a second pixel isolation structure including a second trench and a third trench each recessed from the second surface of the semiconductor substrate into the semiconductor substrate and a dielectric layer in the second trench and the third trench. The first pixel isolation structure and the second pixel isolation structure may contact each other and separate the pixels from each other in the semiconductor substrate.

20 Claims, 15 Drawing Sheets

A1-A1'

(56)  References Cited

U.S. PATENT DOCUMENTS

|  |  |  |  |
|---|---|---|---|
| 9,761,624 | B2 | 9/2017 | Velichko et al. |
| 10,432,883 | B1 * | 10/2019 | Chapman ............ H10F 39/8057 |
| 10,566,380 | B2 | 2/2020 | Jung et al. |
| 10,840,285 | B2 | 11/2020 | Kim et al. |
| 11,121,163 | B2 | 9/2021 | Kim |
| 11,322,530 | B2 * | 5/2022 | Zhang ..................... H10F 39/18 |
| 2017/0229496 | A1 * | 8/2017 | Velichko ............... H10F 39/014 |
| 2019/0296060 | A1 * | 9/2019 | Oh ........................ H10F 39/807 |
| 2019/0378865 | A1 * | 12/2019 | Zhang ................. H10F 39/8053 |
| 2022/0173143 | A1 * | 6/2022 | Kim .................. H10F 39/80373 |

* cited by examiner

IMAGE SENSORS INCLUDING PIXEL ISOLATION STRUCTURE INCLUDING DOUBLE TRENCH

CROSS-REFERENCE TO RELATED APPLICATION

This application claims priority under 35 U.S.C. § 119 to Korean Patent Application No. 10-2021-0084745, filed on Jun. 29, 2021 in the Korean Intellectual Property Office, the disclosure of which is incorporated by reference herein in its entirety.

BACKGROUND

The inventive concept relates to an image sensor, and more particularly, to an image sensor including a pixel isolation structure arranged in a double trench.

Image sensors are devices converting optical image signals into electrical signals. Recently, along with the development in the computer industry and communication industry, the demand for an image sensor with improved performance has increased in various areas such as smartphones, digital cameras, game devices, Internet of Things, robots, surveillance cameras, and medical micro cameras.

The image sensors may be largely classified into charge coupled device (CCD) image sensors and complementary metal-oxide semiconductor (CMOS) image sensors. A CCD image sensor may have lower noise and provide a better picture, compared to a CMOS image sensor.

However, the CMOS image sensor may be implemented with a simple driving method and various scanning methods. In addition, the CMOS image sensor may integrate a signal processing circuit in a single chip, and accordingly, a product may be easily miniaturized and power consumption of the product may be low. In addition, because CMOS process technology is compatibly usable, the manufacturing cost may be low. Recently, CMOS image sensing devices are widely used in mobile devices.

SUMMARY

The inventive concept provides an image sensor capable of improving dark level characteristics by controlling dark current.

The issues to be solved by the technical idea of the inventive concept are not limited to the above-mentioned issues, and other issues not mentioned may be clearly understood by one of ordinary skill in the art from the following descriptions.

According to an aspect of the inventive concept, there is provided an image sensor including: a semiconductor substrate including a first surface and a second surface opposite the first surface, and including a plurality of pixels; a first pixel isolation structure including a first trench extending from the first surface of the semiconductor substrate into the semiconductor substrate and a conductive layer arranged in the first trench; and a second pixel isolation structure including a second trench and a third trench each extending from the second surface of the semiconductor substrate into the semiconductor substrate and a dielectric layer arranged in the second trench and the third trench, wherein the first pixel isolation structure and the second pixel isolation structure contact each other and separate the plurality of pixels from each other. The first trench may be recessed from the first surface of the semiconductor substrate into the semiconductor substrate, and the second and third trenches may be recessed from the second surface of the semiconductor substrate into the semiconductor substrate.

According to another aspect of the inventive concept, there is provided an image sensor including: a semiconductor substrate including a first surface and a second surface opposite the first surface, and including a plurality of photoelectric conversion regions; a micro lens arranged on the second surface of the semiconductor substrate; and a pixel isolation structure separating the plurality of photoelectric conversion regions from each other, wherein the pixel isolation structure includes: a first trench extending from the second surface of the semiconductor substrate into the semiconductor substrate; a second trench extending from the second surface into the semiconductor substrate and being spaced apart from the first trench; and an isolation region that is between the first trench and the second trench, and is configured to be applied with a bias. The first and second trenches may be recessed from the second surface of the semiconductor substrate into the semiconductor substrate.

According to another aspect of the inventive concept, there is provided an image sensor including: a pixel array including a plurality of pixels on a semiconductor substrate; a bias generator configured to supply a bias to the pixel array; and a plurality of conductive pads configured to apply the bias to the pixel array by received from the bias generator, wherein the pixel array includes: a first pixel isolation structure including a first trench extending from a first surface of the semiconductor substrate into the semiconductor substrate and a conductive layer arranged in the first trench; and a second pixel isolation structure including a second trench and a third trench each extending from a second surface of the semiconductor substrate, a dielectric layer arranged in the second trench and the third trench, and an isolation region formed between the second trench and the third trench, wherein the first pixel isolation structure and the second pixel isolation structure contact each other and separate the plurality of pixels from each other, and the bias generator is configured to apply a first negative bias to the isolation region via a first pad of the plurality of conductive pads. The second surface of the semiconductor substrate may be opposite the first surface of the semiconductor substrate. The first trench may be recessed from the first surface of the semiconductor substrate into the semiconductor substrate, and the second and third trenches may be recessed from the second surface of the semiconductor substrate into the semiconductor substrate.

BRIEF DESCRIPTION OF THE DRAWINGS

Embodiments of the inventive concept will be more clearly understood from the following detailed description taken in conjunction with the accompanying drawings in which:

FIG. 4 is a cross-sectional view taken along line A2-A2' in FIG. 1 according to an example embodiment of the inventive concept;

FIG. 8 is a cross-sectional view of an image sensor according to an example embodiment of the inventive concept;

FIGS. 9A and 9B are cross-sectional views of an image sensor according to example embodiments of the inventive concept;

DETAILED DESCRIPTION

Hereinafter, example embodiments of the inventive concept will be described in detail with reference to the accompanying drawings. When descriptions are given with reference to drawings, identical or corresponding components may be given with identical drawing reference numbers, and duplicate descriptions thereof are omitted.

Figure 1:
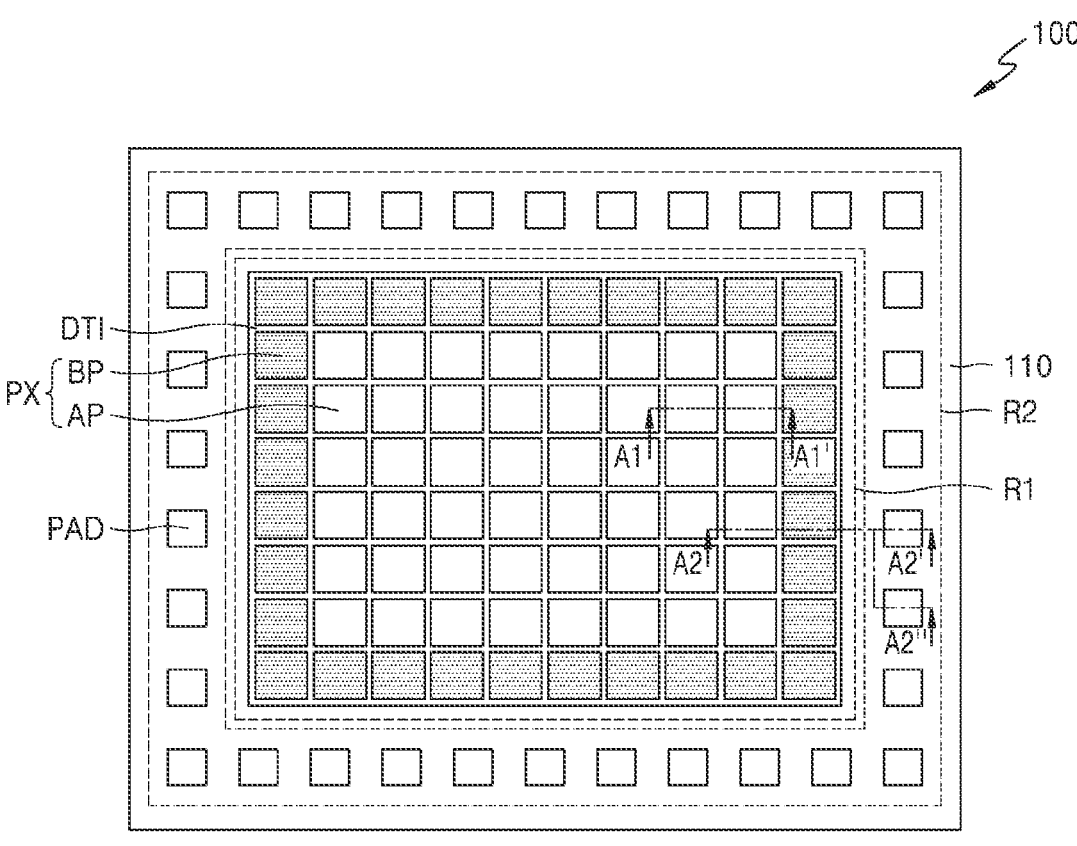
FIG. 1 is a layout diagram of an image sensor according to an example embodiment of the inventive concept.

FIG. 1 is a layout diagram of an image sensor 100 according to an example embodiment of the inventive concept.

Referring to FIG. 1, the image sensor 100 may include a pixel region R1 formed on a semiconductor substrate 110 and a pad region R2.

The pixel region R1 may be arranged at the center portion of the semiconductor substrate 110, and the pad region R2 may be arranged at an edge portion of the semiconductor substrate 110. Even though the pad region R2 is illustrated as, as an example, entirely surrounding the pixel region R1, the pad region R2 is not limited thereto, and in another embodiment, the pad region R2 may partially surround the pixel region R1.

A conductive pad PAD may be arranged in the pad region R2. The conductive pad PAD may be configured to transmit or receive electrical signals to and from an external device, etc. An external bias may be applied to the conductive pad PAD. The conductive pad PAD may be electrically connected to the pixel region R1. Accordingly, the conductive pad PAD may transfer a bias to the pixel region R1.

The pixel region R1 may include a plurality of pixels PX and a pixel isolation structure DTI. In the pixel region R1, the plurality of pixels PX may form rows and columns in a first direction X parallel with an upper surface of the semiconductor substrate 110, and in a second direction Y parallel with the upper surface of the semiconductor substrate 110 and perpendicular to the first direction X, and may be arranged in a matrix form.

Some of the plurality of pixels PX may include active pixels AP. A photoelectric conversion region may be arranged in the active pixel AP. The active pixel AP may convert an incident optical signal into an electrical signal.

Some of the plurality of pixels PX may include optical black pixels BP. The optical black pixel BP may generate a dark level signal, which is irrelevant to incident light. The dark level signal may denote dark noise, which occurs due to other factors except for the incident light (for example, unique noise according to temperature, a pixel structure, or the like). Accordingly, the optical black pixel BP may function as a reference pixel in the pixel region R1. Image data of the active pixel AP may be computed (for example, subtracted) with a signal output from at least one optical black pixel BP corresponding to a corresponding row, and accordingly, the image data from which the dark noise is removed may be obtained.

The optical black pixel BP may, unlike the active pixel AP, have a structure in which light reception is blocked. The optical black pixel BP may be operated by the same pixel control signal, as the active pixel AP of the same row as the optical black pixel BP. In FIG. 1, the optical black pixel BP is arranged to surround the edge portion of the pixel region R1, but is not limited thereto, and in another embodiment, may be arranged at a portion of the edge portion of the pixel region R1.

The pixel isolation structure DTI may define the plurality of pixels PX. The pixel isolation structure DTI may surround the plurality of pixels PX entirely or at least some thereof. The pixel isolation structure DTI in FIG. 1 is briefly illustrated for description, and hereinafter, the pixel isolation structure DTI is described in detail with reference to FIG. 1.

Figure 2:
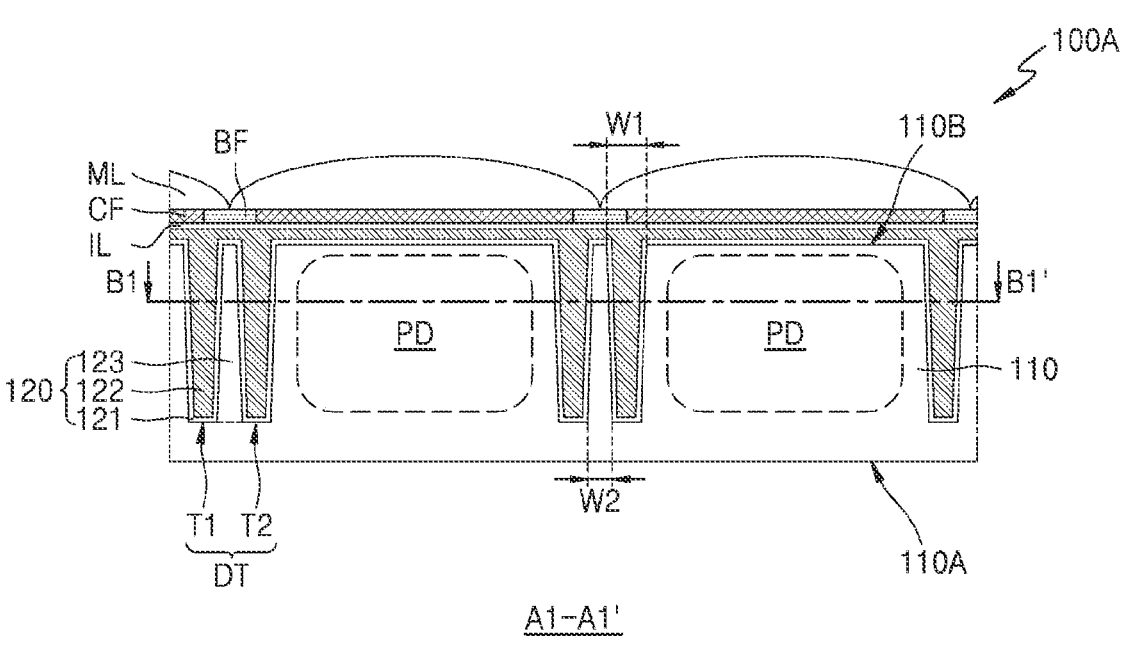
FIG. 2 is a cross-sectional view taken along line A1-A1' in FIG. 1 according to an example embodiment of the inventive concept.
Figure 3:
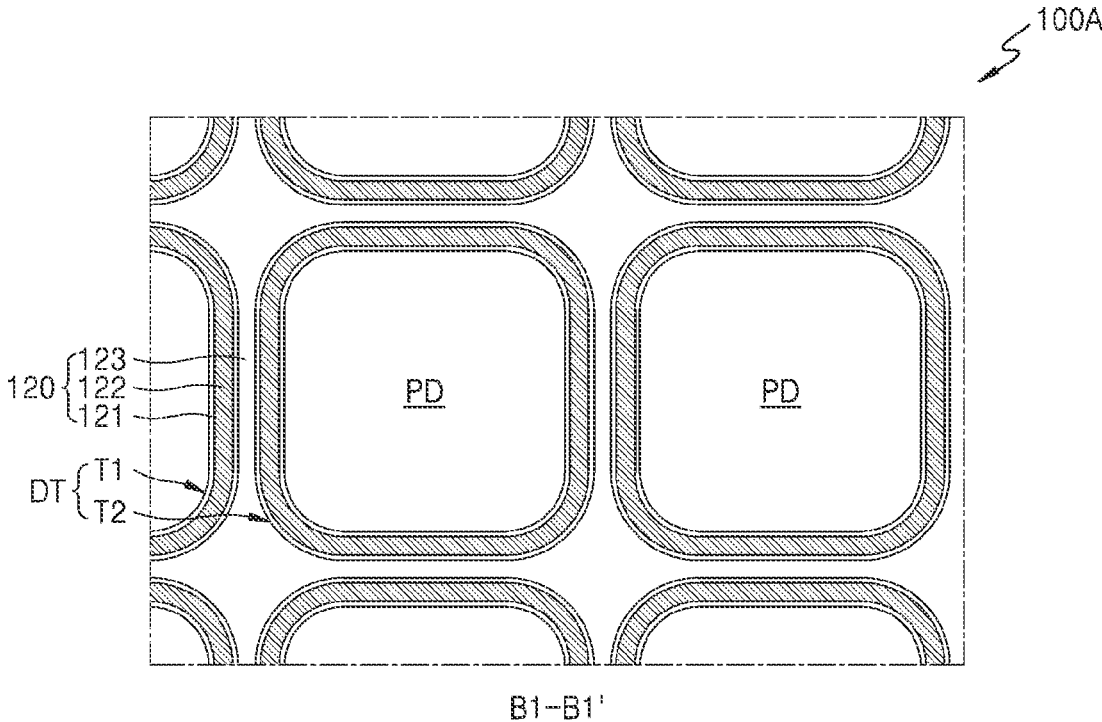
FIG. 3 is a cross-sectional view taken along line B1-B1' in FIG. 2 according to an example embodiment of the inventive concept.

FIG. 2 is a cross-sectional view taken along line A1-A1' in FIG. 1, and FIG. 3 is a cross-sectional view taken along line B1-B1' in FIG. 2. FIG. 2 is a diagram of an image sensor 100A taken along line A1-A1' in FIG. 1, according to an example embodiment of the inventive concept, and FIG. 3 is a diagram of a pixel isolation structure 120 taken along line B1-B1' in FIG. 2, according to an example embodiment of the inventive concept. Hereinafter, descriptions are given with reference to FIG. 1.

Referring to FIG. 2, the image sensor 100A may include a photoelectric conversion region PD formed in the semiconductor substrate 110, the pixel isolation structure 120, a color filter CF, and a micro lens ML.

The semiconductor substrate 110 may include a first surface 110A and a second surface 110B opposite each other. Hereinafter, for convenience of description, a surface of the semiconductor substrate 110, on which the micro lens ML is arranged, may be referred to as the second surface 110B, and a surface opposite to the second surface 110B may be referred to as the first surface 110A. Accordingly, the first surface 110A may be defined as a front side, and the second surface 110B may be defined as a back side.

The semiconductor substrate 110 may include a p-type semiconductor substrate. For example, the semiconductor substrate 110 may include a p-type silicon substrate. In example embodiments, the semiconductor substrate 110 may include a p-type bulk substrate, and a p-type or an n-type epitaxial layer grown thereon. In other embodiments, the semiconductor substrate 110 may include an n-type bulk substrate, and a p-type or an n-type epitaxial layer grown thereon. In another embodiment, the semiconductor substrate 110 may include an organic plastic substrate.

The photoelectric conversion region PD may be arranged in each of the plurality of pixels PX. The photoelectric conversion region PD may be formed as an n-type doping region by using an ion implantation process. According to an embodiment, the photoelectric conversion region PD may have a doping concentration difference between an upper portion and a lower portion thereof, and accordingly, may have a potential slope. The photoelectric conversion region PD may also be formed in a shape in which a plurality of doping regions are stacked in a vertical direction. The photoelectric conversion region PD may be formed over a wide area, to increase a fill-factor that represents light receiving efficiency.

The pixel isolation structure 120 may be arranged in the semiconductor substrate 110. The pixel isolation structure 120 may correspond to the pixel isolation structure DTI in FIG. 1. Accordingly, the plurality of pixels PX may be defined by the pixel isolation structure 120. The pixel isolation structure 120 may be arranged between one of the plurality of photoelectric conversion regions PD and the photoelectric conversion region PD adjacent thereto. The one photoelectric conversion region PD and the other photoelectric conversion region PD adjacent thereto may be physically and electrically isolated from each other by the pixel isolation structure 120.

The pixel isolation structure 120 may include a double trench DT extending from the second surface 110B of the semiconductor substrate 110 to the inside of the semiconductor substrate 110. The double trench DT may have a shape which is vertically deep, for electrical isolation and optical isolation between the plurality of photoelectric conversion regions PD. As the double trench DT is formed by using an etching process performed on the second surface 110B of the semiconductor substrate 110, the pixel isolation structure 120 may be an isolation structure of a backside deep trench isolation (BDTI)-type.

The double trench DT may include a first trench T1 and a second trench T2 arranged apart from each other. The first trench T1 and the second trench T2 may extend from second surface 110B of the semiconductor substrate 110 toward the first surface 110A of the semiconductor substrate 110. In an example embodiment, the first trench T1 and the second trench T2 may penetrate the semiconductor substrate 110. In another embodiment, the first trench T1 and the second trench T2 may not penetrate the semiconductor substrate 110. A width W1 of the first trench T1 and the second trench T2 may be less from the second surface 110B toward the first surface 110A. Each of the first trench T1 and the second trench T2 may be recessed from the second surface 110B of the semiconductor substrate 110 into the semiconductor substrate 110, and surfaces of the semiconductor substrate 110 defining sides of the first trench T1 and the second trench T2 may contact the second surface 110B of the semiconductor substrate 110, as illustrated in FIG. 2. The width W1 of the first trench T1 and the second trench T2 may decrease along a direction from the second surface 110B toward the first surface 110A, as illustrated in FIG. 2. The direction from the second surface 110B toward the first surface 110A may be a thickness direction of the semiconductor substrate 110.

The pixel isolation structure 120 may include an insulating liner 121, a dielectric layer 122, and an isolation region 123.

The insulating liner 121 may be arranged on inner walls of the first trench T1 and the second trench T2 and on the second surface 110B of the semiconductor substrate 110. The insulating liner 121 may include an insulating material having a different refractive index from the semiconductor substrate 110. The insulating liner 121 may include a material having higher reflectivity than the semiconductor substrate 110. For example, the insulating liner 121 may include one of a silicon oxide layer, a silicon nitride layer, and a silicon oxide nitride layer, and may also include metal oxide such as hafnium oxide, aluminum oxide, and tantalum oxide. However, the scope of the inventive concept is not limited thereto. The insulating liner 121 may reduce or prevent an optical crosstalk phenomenon in which light incident to the photoelectric conversion region PD penetrates another pixel and decreases a ratio of signal over noise.

The dielectric layer 122 may be formed on the insulating liner 121. The dielectric layer 122 on the insulating liner 121 may fill an internal space of the first trench T1 and the second trench T2, and may cover the insulating liner 121 formed on the second surface 110B. Accordingly, the dielectric layer 122 may have a shape surrounded by the insulating liner 121 in the semiconductor substrate 110, and may have a shape covering the second surface 110B of the semiconductor substrate 110.

The dielectric layer 122 may include a metal oxide such as hafnium oxide, aluminum oxide, and tantalum oxide. The dielectric layer 122 may include a different material from the insulating liner 121. For example, the dielectric layer 122 may include hafnium oxide, and the insulating liner 121 may include aluminum oxide. In another embodiment, the insulating liner 121 and the dielectric layer 122 may include the same material as each other.

The isolation region 123 may be arranged between the first trench T1 and the second trench T2. The isolation region 123 may be isolated from the photoelectric conversion region PD by the first trench T1 and the second trench T2. A width W2 of the isolation region 123 may be greater from the second surface 110B toward the first surface 110A. The isolation region 123 and the semiconductor substrate 110 may include the same material as each other. The width W2 of the isolation region 123 may increase along a direction from the second surface 110B toward the first surface 110A.

Referring to FIG. 3, the isolation region 123 may be isolated from the photoelectric conversion region PD by being formed between the first trench T1 and the second trench T2. The isolation region 123 may have a mesh shape. The isolation region 123 may partially or entirely surround the entirety the photoelectric conversion region PD in the semiconductor substrate 110.

The isolation region 123 may be applied with a bias. For example, a bias may be a negative bias. When a bias is applied to the isolation region 123, electrons in the isolation region 123 may move close to the insulating liner 121, and as a result, holes in the semiconductor substrate 110 may move to an interface of the insulating liner 121, be accumulated, and be fixed. In this manner, when the holes in the semiconductor substrate 110 are accumulated and are fixed on the interface of the insulating liner 121, a dark source (for example, electrons) occurring on the interface of the double trench DT may be efficiently suppressed. Accordingly, dark current may be controlled, and noise in a pixel signal may be reduced.

Referring to FIG. 2 again, an insulating layer IL may be arranged on the dielectric layer 122. The insulating layer IL may be substantially arranged on the whole area of the second surface 110B. In example embodiments, the insulating layer IL may include a metal oxide such as hafnium oxide, aluminum oxide, and tantalum oxide. In other embodiments, the insulating layer IL may include an insulating material such as silicon oxide, silicon nitride, and a low dielectric material. The insulating layer IL may include the same material as the insulating liner 121.

The color filter CF and a color filter boundary fence BF may be arranged on the insulating layer IL. The color filter CF may be formed on the insulating layer IL, and may selectively transmit a light beam of a particular wavelength (for example, red, green, blue, magenta, yellow, cyan, etc.). According to an embodiment, a reflection prevention layer may be arranged under the color filter CF. According to an embodiment, when the active pixel AP corresponds to a depth pixel, the color filter CF may be omitted or replaced by an infrared filter. In an example embodiment, the color filter CF may be omitted.

The color filter boundary fence BF may be formed on the insulating layer IL, and may be arranged between the color filters CF. In other words, the color filter boundary fence BF may be formed between adjacent color filters CF to reduce or prevent the optical crosstalk between the adjacent color filters CF. In another embodiment, an insulating liner may be further included between the color filter boundary fence BF and the color filter CF. The insulating liner may include an insulating material, for example, metal oxide. Heights of the color filter boundary fence BF and the color filter CF may be the same as each other. The color filter boundary fence BF may include a metal material (for example, tungsten) having a high optical absorption rate, but is not limited thereto.

The micro lens ML may be formed on the color filter CF, and may improve the optical absorption rate by increasing light gathering power for the incident light.

Hereinafter, detailed descriptions are given with reference to FIG. 4 for a structure in which a bias is applied to the isolation region 123.

Figure 4:
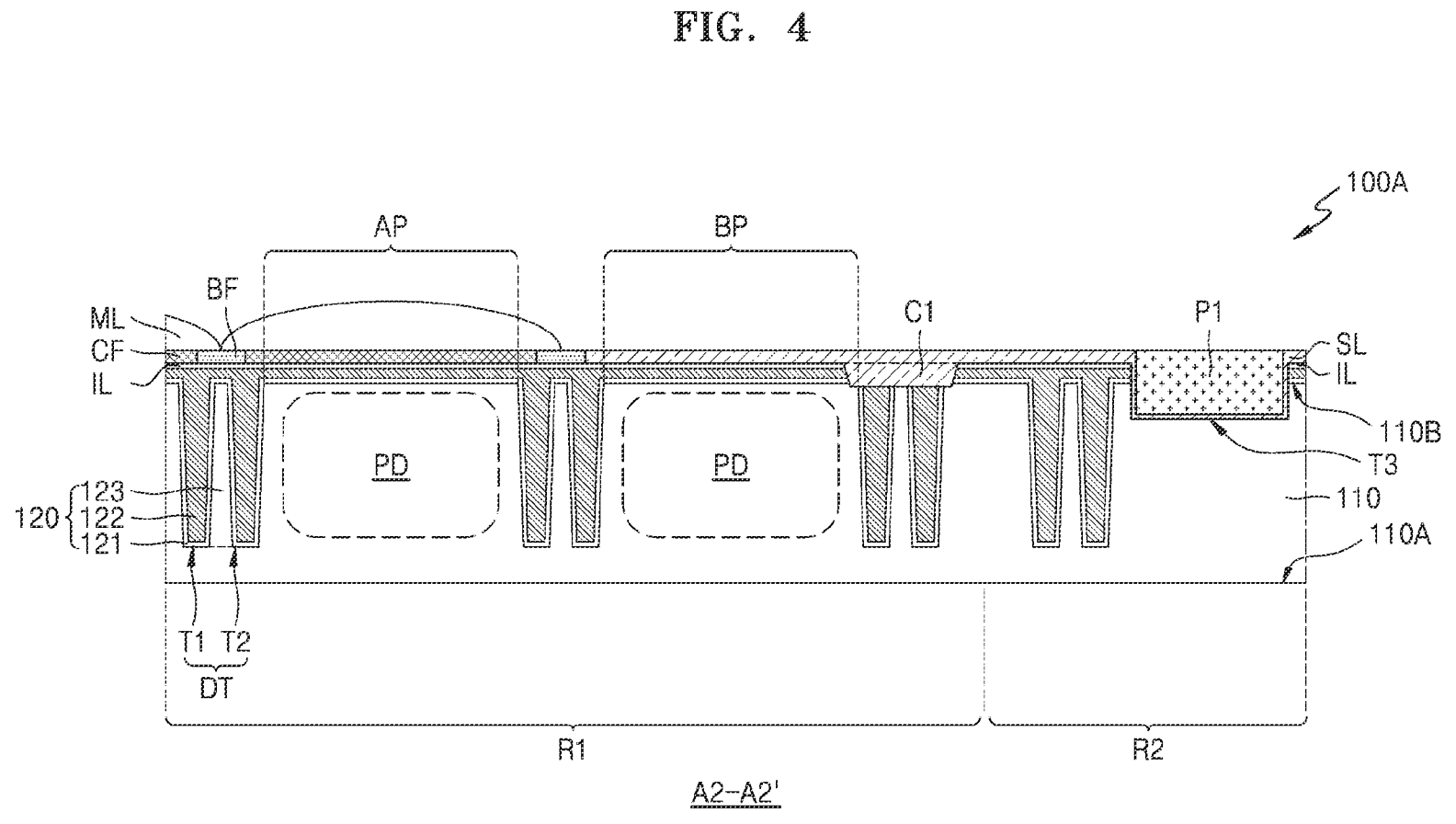

FIG. 4 is a cross-sectional view taken along line A2-A2' in FIG. 1. FIG. 4 is a diagram of a structure in which a bias is applied to the isolation region 123 in FIG. 2. Hereinafter, descriptions are given with reference to FIGS. 1 and 2.

Referring to FIG. 4, the image sensor 100A may include the active pixel AP, the optical black pixel BP, a first contact structure C1, and a first pad P1 along line A2-A2'.

The active pixel AP and the optical black pixel BP may be arranged in the pixel region R1. The optical black pixel BP may include the semiconductor substrate 110, the photoelectric conversion region PD, the pixel isolation structure 120, the insulating layer IL, and a shielding layer SL. The optical black pixel BP may selectively further include the micro lens ML. The photoelectric conversion region PD is illustrated as being included in the optical black pixel BP, but is not limited thereto, and according to an embodiment, the photoelectric conversion region PD may not be included in the optical black pixel BP. The optical black pixel BP may include a similar structure to the active pixel AP. Thus, duplicate descriptions thereof are omitted.

The shielding layer SL may be arranged on the insulating layer IL. When the shielding layer SL is arranged to cover the second surface 110B of the optical black pixel BP, the incident light may be blocked so that the incident light may not penetrate into the optical black pixel BP. The shielding layer SL may include a metal material having a high optical absorption rate. For example, the shielding layer SL may include at least one metal material of W, Al, Ti, Ru, Co, Ni, Cu, Au, Ag, and Pt. According to an embodiment, a high-reflectivity material may be arranged on the shielding layer SL. According to an embodiment, a barrier layer (for example, titanium) may be additionally arranged under the shielding layer SL.

The first contact structure C1 may be arranged in the pixel region R1, and according to an embodiment, may be arranged between the pixel region R1 and the pad region R2. The first contact structure C1 may be formed on the second surface 110B of the semiconductor substrate 110. According to an embodiment, the first contact structure C1 may have a shape extending from the second surface 110B thereof into the semiconductor substrate 110. The shielding layer SL may extend from the pixel region R1 to the pad region R2. Accordingly, an upper surface of the first contact structure C1 may be covered by the shielding layer SL. The first contact structure C1 may include the same material as the shielding layer SL. Accordingly, the first contact structure C1 and the shielding layer SL may include a metal material (for example, tungsten) having a high optical absorption rate. According to an embodiment, the first contact structure C1 and the shielding layer SL may be formed in one body (e.g., a unitary structure), but the embodiment is not limited thereto.

The first contact structure C1 is illustrated as being formed on the pixel isolation structure 120 arranged between the optical black pixel BP and the pad region R2, but is not limited thereto, and in other embodiments, may also be arranged on the pixel isolation structure 120 arranged between the active pixels AP, or may be arranged on the pixel isolation structure 120 between the active pixel AP and the optical black pixel BP.

A lower surface of the first contact structure C1 may contact the pixel isolation structure 120. The lower surface of the first contact structure C1 may directly contact the dielectric layer 122 and the isolation region 123. In other words, the first contact structure C1 may be formed at least on the second surface 110B of the semiconductor substrate 110, and according to an embodiment, a level of the lower surface of the first contact structure C1 may be lower than a level of the second surface 110B thereof. Accordingly, the first contact structure C1 may be electrically connected to the pixel isolation structure 120, and more particularly, may be electrically connected to the isolation region 123. A bias may be applied to the isolation region 123 of the pixel isolation structure 120 via the first contact structure C1.

The first pad P1 may be arranged in the pad region R2. The first pad P1 may fill an internal space of a third trench T3. The third trench T3 may extend from an upper surface of the insulating layer IL into the semiconductor substrate 110. A width and a height of the third trench T3 may variously formed. The first pad P1 may contact the shielding layer SL. According to an embodiment, the shielding layer SL may be formed to extend between the third trench T3 and the first pad P1. Accordingly, the shielding layer SL may cover a lower surface and side walls of the third trench T3. A thickness of the shielding layer SL inside the third trench T3 may be less than a thickness of the shielding layer SL formed on the optical black pixel BP. The third trench T3 may be recessed from the second surface 110B of the semiconductor substrate 110 into the semiconductor substrate 110, and a surface of the semiconductor substrate 110 defining a side of the third trench T3 may contact the second surface 110B of the semiconductor substrate 110, as illustrated in FIG. 4.

The first pad P1 may include a metal material. For example, the first pad P1 may include at least one metal material of W, Al, Ti, Ru, Co, Ni, Cu, Au, Ag, and Pt. The first pad P1 and the shielding layer SL may include different materials from each other. For example, the first pad P1 may include aluminum, and the shielding layer SL may include tungsten. However, the embodiment is not limited thereto, and according to an embodiment, the first pad P1 and the shielding layer SL may include the same material as each other.

The first pad P1 may receive a bias from a bias generator to be described with reference to FIG. 20. Because the first pad P1 may be formed to directly contact the shielding layer SL, and the shielding layer SL is formed to directly contact the first contact structure C1, the first pad P1 may transfer a bias to the isolation region 123 of the pixel isolation structure 120 via the shielding layer SL.

Figure 5:
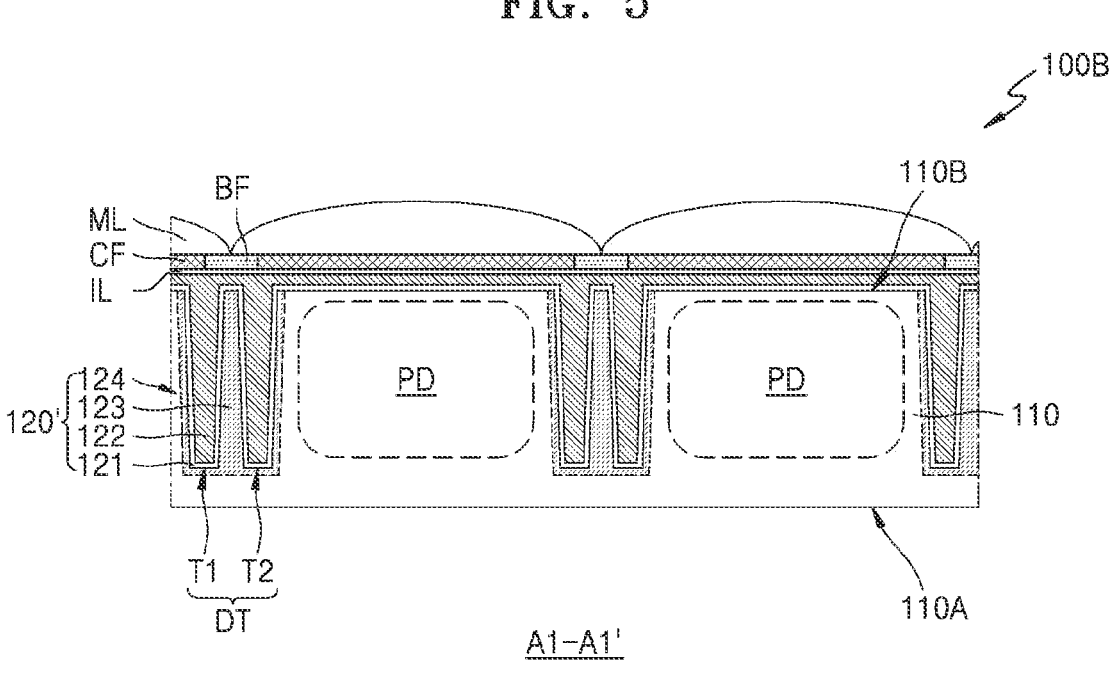
FIG. 5 is a cross-sectional view of an image sensor according to an example embodiment of the inventive concept.

FIG. 5 is a cross-sectional view of an image sensor 100B according to an example embodiment of the inventive concept. FIG. 5 is a cross-sectional view of the image sensor 100B taken along line A1-A1' in FIG. 1, according to an example embodiment, and accordingly, duplicate descriptions of the image sensor 100A of FIG. 2 are omitted. Hereinafter, descriptions are given with reference to FIG. 1.

Referring to FIG. 5, the image sensor 100B may include the semiconductor substrate 110, the photoelectric conversion region PD, a pixel isolation structure 120', the insulating layer IL, the color filter CF, the color filter boundary fence BF, and the micro lens ML.

The pixel isolation structure 120' may include the insulating liner 121, the dielectric layer 122, the isolation region 123, and an impurity region 124. The impurity region 124 may be arranged around the double trench DT in the semiconductor substrate 110, and may be a region doped with impurities. The impurity region 124 may have a shape surrounding the double trench DT. The impurity region 124 may partially overlap the isolation region 123. In other words, the isolation region 123 may be formed in a portion of the impurity region 124. The impurity region 124 may not overlap the photoelectric conversion region PD. Impurities may include Group III elements (for example, boron), but are not limited thereto. In another embodiment, impurities may include Group V elements. In some embodiments, at least a portion of the double trench DT may be in the impurity region 124.

Because the pixel isolation structure 120' includes the impurity region 124, the bias applied to the isolation region 123 may be transferred faster to the entire pixel region R1, and dark current due to defects on a surface of the double trench DT may be reduced.

Figure 6:
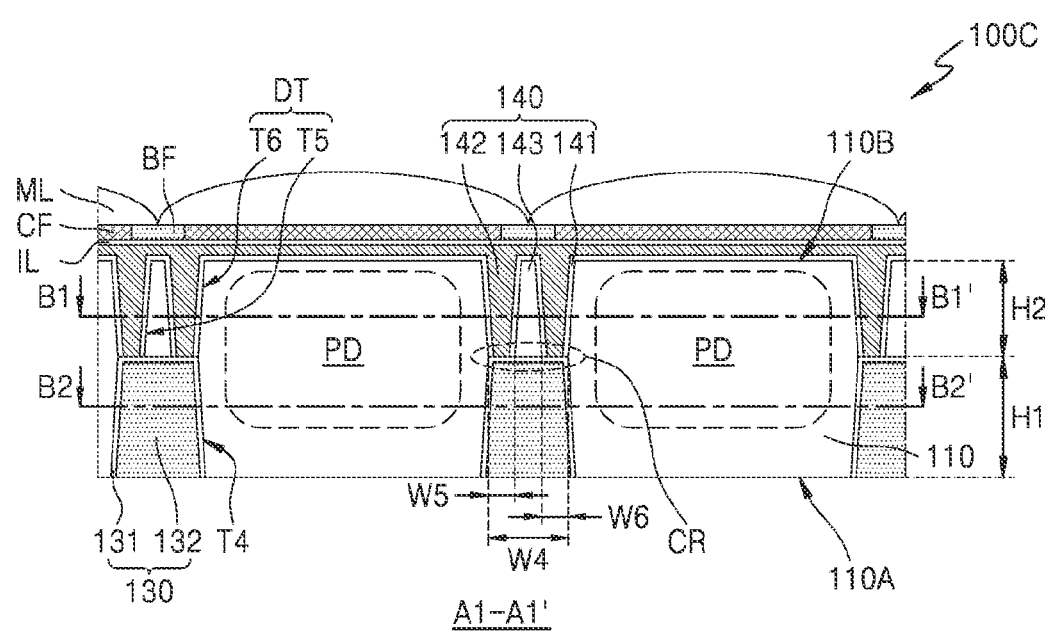
FIG. 6 is a cross-sectional view of an image sensor according to an example embodiment of the inventive concept.
Figure 7:
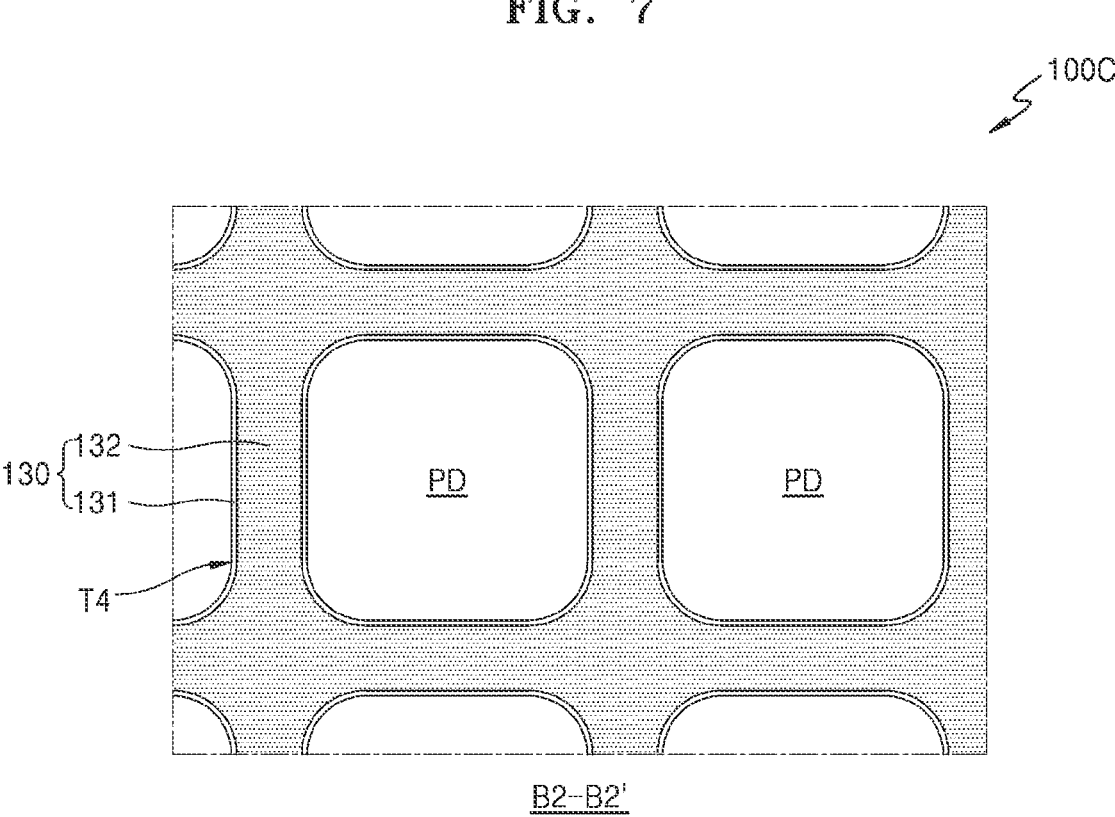
FIG. 7 is a cross-sectional view taken along line B2-B2' in FIG. 6 according to an example embodiment of the inventive concept.

FIG. 6 is a cross-sectional view taken along line A1-A1' in FIG. 1, and FIG. 7 is a cross-sectional view taken along line B2-B2' in FIG. 6. FIG. 6 is a cross-sectional view of an image sensor 100C taken along line A1-A1' in FIG. 1, according to an example embodiment of the inventive concept, and FIG. 7 is a cross-sectional view of a first pixel isolation structure 130 taken along line B2-B2' in FIG. 6, according to an example embodiment of the inventive concept. Hereinafter, descriptions are given with reference to FIG. 1.

Referring to FIG. 6, the image sensor 100C may include the photoelectric conversion region PD formed in the semiconductor substrate 110, the first pixel isolation structure 130, a second pixel isolation structure 140, the insulating layer IL, the color filter CF, the color filter boundary fence BF, and the micro lens ML. Components except for the first pixel isolation structure 130 and the second pixel isolation structure 140 may be the same as the components of the image sensor 100A of FIG. 2, and thus, descriptions thereof are omitted.

The first pixel isolation structure 130 and the second pixel isolation structure 140 may be arranged in the semiconductor substrate 110. The first pixel isolation structure 130 and the second pixel isolation structure 140 may correspond to the pixel isolation structure DTI. Accordingly, the plurality of pixels PX may be defined by the first pixel isolation structure 130 and the second pixel isolation structure 140. One photoelectric conversion region PD and another photoelectric conversion region PD adjacent thereto may be physically and electrically isolated from each other by the first pixel isolation structure 130 and the second pixel isolation structure 140.

The first pixel isolation structure 130 may include a fourth trench T4, a first insulating liner 131, and a conductive layer 132. The fourth trench T4 may extend from the first surface 110A of the semiconductor substrate 110 into the semiconductor substrate 110. The fourth trench T4 may have a shape which is vertically deep from the first surface 110A of the semiconductor substrate 110. When the fourth trench T4 is formed by using an etching process performed on the first surface 110A of the semiconductor substrate 110, the first pixel isolation structure 130 may be an isolation structure of a frontside deep trench isolation (FDTI) type. A width of the fourth trench T4 may be less from the first surface 110A toward the second surface 110B. The fourth trench T4 may be recessed from the first surface 110A of the semiconductor substrate 110 into the semiconductor substrate 110, and a surface of the semiconductor substrate 110 defining a side of the fourth trench T4 may contact the first surface 110A of the semiconductor substrate 110, as illustrated in FIG. 6. The width of the fourth trench T4 may decrease with a depth of fourth trench T4.

The first insulating liner 131 may be arranged on a bottom surface and side walls of the fourth trench T4. The first insulating liner 131 may include a metal oxide such as hafnium oxide, aluminum oxide, and tantalum oxide. In this case, the first insulating liner 131 may operate as a negative fixed charge layer, but is not limited thereto. In other embodiments, the first insulating liner 131 may include an insulating material such as silicon oxide, silicon nitride, and silicon oxynitride. The first insulating liner 131 may reduce or prevent the optical crosstalk phenomenon.

The conductive layer 132 may be formed on the first insulating liner 131, and may fill an internal space of the fourth trench T4. The conductive layer 132 may have a shape surrounded by the first insulating liner 131. The conductive layer 132 may include at least one of doped polysilicon, a metal, metal silicide, metal nitride, and a metal-included layer.

Referring to FIG. 7, the photoelectric conversion regions PD may be isolated from each other by the first pixel isolation structure 130. The first pixel isolation structure 130 may have a mesh shape. The conductive layer 132 may be isolated from the photoelectric conversion region PD by the first insulating liner 131.

The conductive layer 132 may be applied with a bias. For example, a bias may be a negative bias, but is not limited thereto. In another embodiment, when the semiconductor substrate 110 includes an n-type semiconductor substrate, the bias may be a positive bias. When the bias is applied to the conductive layer 132, electrons in the first insulating liner 131 may move close to the first insulating liner 131, and as a result, holes in the semiconductor substrate 110 may move to an interface of the first insulating liner 131, be accumulated, and be fixed. In this manner, when the holes in the semiconductor substrate 110 are accumulate and are fixed on the interface of the first insulating liner 131, a dark source (for example, electrons) occurring on the interface of the fourth trench T4 may be efficiently suppressed. Accordingly, dark current may be controlled, and noise in a pixel signal may be reduced.

Referring to FIG. 6 again, the second pixel isolation structure 140 may include the double trench DT, a second insulating liner 141, a dielectric layer 142, and an isolation region 143. The second pixel isolation structure 140 may be similar to the pixel isolation structure 120 in FIG. 2. According to an embodiment, a height H2 of the second pixel isolation structure 140 may be less than a height of the pixel isolation structure 120 in FIG. 2. The second pixel isolation structure 140 may be an isolation structure of a BDTI type.

The double trench DT may include a fifth trench T5 and a sixth trench T6 arranged apart from each other. The fifth trench T5 and the sixth trench T6 may be formed in the semiconductor substrate 110. The fifth trench T5 and the sixth trench T6 may extend from the second surface 110B of the semiconductor substrate 110 toward the first surface 110A. Widths of the fifth trench T5 and the sixth trench T6 may be less from the second surface 110B toward the first surface 110A. According to an embodiment, a bottom surface of the double trench DT is illustrated as flat, but is not limited thereto, and according to an embodiment, may have a shape of penetrating the fourth trench T4. According to an embodiment, the fifth trench T5 and the sixth trench T6 may also have different widths from each other. Each of the fifth trench T5 and the sixth trench T6 may be recessed from the second surface 110B of the semiconductor substrate 110 into the semiconductor substrate 110, and surfaces of the semiconductor substrate 110 defining sides of the fifth trench T5 and the sixth trench T6 may contact the second surface 110B of the semiconductor substrate 110, as illustrated in FIG. 6.

The second insulating liner 141 may be arranged on internal walls of the fifth trench T5 and the sixth trench T6, and on the second surface 110B. The second insulating liner 141 may include one of a silicon oxide layer, a silicon nitride layer, and a silicon oxide nitride layer, and may also include metal oxide such as hafnium oxide, aluminum oxide, and tantalum oxide. However, the scope of the inventive concept is not limited thereto. The second insulating liner 141 may reduce or prevent the optical crosstalk phenomenon.

The dielectric layer 142 may be formed on the second insulating liner 141. The dielectric layer 142 may fill an internal space of the fifth trench T5 and the sixth trench T6 on the second insulating liner 141, and may cover the second insulating liner 141 formed on the second surface 110B. Accordingly, the dielectric layer 142 may have a shape surrounded by the second insulating liner 141 in the semiconductor substrate 110, and may have a shape covering the second surface 110B of the semiconductor substrate 110. The dielectric layer 142 may include a metal oxide such as hafnium oxide, aluminum oxide, and tantalum oxide.

The isolation region 143 may be arranged between the fifth trench T5 and the sixth trench T6. The isolation region 143 may be isolated from the photoelectric conversion region PD by the fifth trench T5 and the sixth trench T6. The width of the isolation region 143 may be greater from the second surface 110B toward the first surface 110A. The isolation region 143 and the semiconductor substrate 110 may include the same material as each other. The isolation region 143 and the conductive layer 132 may include different materials from each other. For example, the isolation region 143 may include a p-type semiconductor substrate, and the conductive layer 132 may include polysilicon. The width of the isolation region 143 may increase along a direction from the second surface 110B toward the first surface 110A.

The cross-sectional view taken along line B1-B1' in FIG. 6 may the same as that in FIG. 3. The second insulating liner 141, the dielectric layer 142, and the isolation region 143 in FIG. 6 may correspond to the insulating liner 121, the dielectric layer 122, and the isolation region 123 in FIG. 3, respectively. Accordingly, the isolation region 143 may be isolated from the photoelectric conversion region PD by being formed between the double trenches DT, and may receive a bias. A bias may be a negative bias, but is not limited thereto, and when a bias is applied to the isolation region 143, dark current may be controlled.

Referring to FIG. 6 again, the first pixel isolation structure 130 and the second pixel isolation structure 140 may contact each other. Accordingly, the first insulating liner 131 and the second insulating liner 141 may directly contact each other. The first pixel isolation structure 130 and the second pixel isolation structure 140 may, by contacting each other, penetrate the semiconductor substrate 110. The first pixel isolation structure 130 and the second pixel isolation structure 140 may, by contacting each other, isolate the plurality of photoelectric conversion regions PD. The first pixel isolation structure 130 and the second pixel isolation structure 140 may, by contacting each other, define pixels PX. The first pixel isolation structure 130 and the second pixel isolation structure 140 may be stacked in a thickness direction of the semiconductor substrate 110 and collectively extend through the semiconductor substrate 110 as illustrated in FIG. 6.

The first pixel isolation structure 130 and the second pixel isolation structure 140 may be continuously formed from the first surface 110A to the second surface 110B. Contact surfaces of the first pixel isolation structure 130 and the second pixel isolation structure 140 may include different shapes according to embodiments. For example, as illustrated in FIG. 6, the contact surfaces may be formed flat, formed convexly in different directions, formed in a structure in which they contact each other, or formed in a structure in which an upper surface of the second pixel isolation structure 140 is inserted into the first pixel isolation structure 130.

When the first pixel isolation structure 130 and the second pixel isolation structure 140 contact each other, the isolation region 143 may be defined as a region surrounded by the first insulating liner 131 and the second insulating liner 141. The isolation region 143 may be surrounded by an upper surface of the first insulating liner 131 and side walls of the first insulating liner 131.

The entire bottom surface of the second pixel isolation structure 140 is illustrated to contact the first pixel isolation structure 130, but is not limited thereto. For example, only portions of bottom surfaces of the fifth trench T5 and the sixth trench T6 may contact the first pixel isolation structure 130, and accordingly, the other portions of the bottom surfaces of the fifth trench T5 and the sixth trench T6 may have a shape of protruding from both sides of the first pixel isolation structure 130. In another embodiment, a portion of side walls of the fifth trench T5 and the sixth trench T6 may contact side walls of the first pixel isolation structure 130. In this case, the first pixel isolation structure 130 may be partially between the fifth trench T5 and the sixth trench T6. In other words, the first pixel isolation structure 130 and the second pixel isolation structure 140 may partially overlap each other in a direction perpendicular to a direction from the first surface 110A toward the second surface 110B.

In a contact region CR where the first pixel isolation structure 130 and the second pixel isolation structure 140 contact each other, a width W4 of the fourth trench T4 may be greater than a width W5 of the fifth trench T5. In the contact region CR, the width W4 of the fourth trench T4 may be greater than a sum of the width W5 of the fifth trench T5 and a width W6 of the sixth trench T6. However, the embodiment is not limited thereto, and the width W4 of the fourth trench T4 may be the same as the width W5 of the fifth trench T5. In this case, the second pixel isolation structure 140 may be formed on the first pixel isolation structure 130, and may have a shape of protruding from the both sides of the first pixel isolation structure 130 or a shape in which the side walls of the second pixel isolation structure 140 contact the side walls of the first pixel isolation structure 130. The width W5 of the fifth trench T5 may be the same as or different from the width W6 of the sixth trench T6.

A height H1 of the first pixel isolation structure 130 formed in the semiconductor substrate 110 may be the same as or different from the height H2 of the second pixel isolation structure 140. For example, the height H1 of the first pixel isolation structure 130 may be greater than the height H2 of the second pixel isolation structure 140, and according to an embodiment, the height H1 of the first pixel isolation structure 130 may be less than the height H2 of the second pixel isolation structure 140.

A bias may be applied to the conductive layer 132 and the isolation region 143. According to an embodiment, a bias may be applied only to the isolation region 143, or only to the conductive layer 132, or to both the isolation region 143 and the conductive layer 132. The bias applied to the conductive layer 132 and the isolation region 143 may include a negative bias. The bias applied to the conductive layer 132 and the isolation region 143 may the same as or different from each other. The bias applied to the conductive layer 132 and the isolation region 143 is described in detail with reference to FIGS. 8 through 9B.

Figure 8:
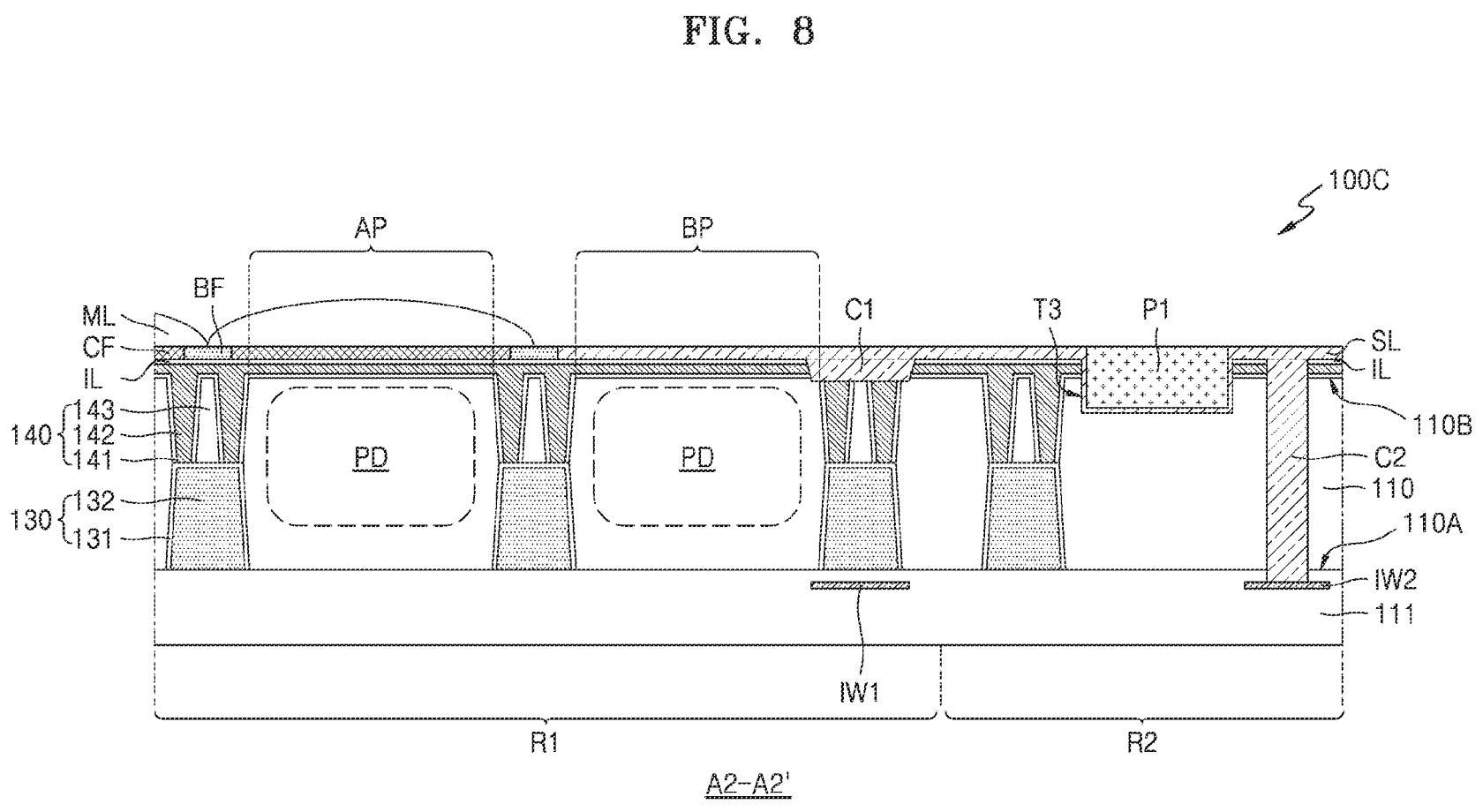

FIG. 8 is a cross-sectional view of the image sensor 100C taken along line A2-A2' in FIG. 1, according to an example embodiment of the inventive concept. FIG. 8 is a diagram of a structure in which an identical bias is applied to the conductive layer 132 and the isolation region 143 in FIG. 6. Hereinafter, descriptions are given with reference to FIGS. 1, 4, and 6, and duplicate descriptions thereof are omitted.

Referring to FIG. 8, the image sensor 100C may include, along line A2-A2' in FIG. 1, an interlayer insulating layer 111, the active pixel AP, the optical black pixel BP, the first contact structure C1, a first internal wiring IW1, the first pad P1, a second contact structure C2, and a second internal wiring IW2. The active pixel AP, the optical black pixel BP, the first contact structure C1, and the first pad P1 included in the image sensor 100C may correspond to the optical black pixel BP, the first contact structure C1, and the first pad P1 described above with reference to FIG. 4, respectively.

The interlayer insulating layer 111 may be arranged on the first surface 110A of the semiconductor substrate 110. The interlayer insulating layer 111 may include any one of silicon nitride and silicon oxynitride. In an example embodiment, the interlayer insulating layer 111 may also be formed in a structure in which two or more insulating materials are stacked. In an example embodiment, an etching stop layer including a material having an etch selectivity with respect to the interlayer insulating layer 111 may be additionally arranged between the interlayer insulating layer 111 and the first surface 110A of the semiconductor substrate 110.

The second contact structure C2 may be arranged in the pad region R2. According to an embodiment, the second contact structure C2 may be arranged apart from the pixel region R1 with the first pad P1 therebetween, or may also be arranged between the first pad P1 and the pixel region R1. The second contact structure C2 may penetrate the semiconductor substrate 110 from the second surface 110B to the first surface 110A. The second contact structure C2 may extend into the interlayer insulating layer 111. Accordingly, the second contact structure C2 may extend from the second surface 110B of the semiconductor substrate 110 into the interlayer insulating layer 111.

The shielding layer SL may extend from the pixel region R1 to the pad region R2. Accordingly, an upper surface of the second contact structure C2 may be covered by the shielding layer SL. According to an embodiment, the shielding layer SL may be isolated from the pixel region R1 and the pad region R2 by the first pad P1. In this case, side walls of the shielding layer SL and the first pad P1 may directly contact each other, and be electrically connected to each other.

The second contact structure C2 may include the same material as the shielding layer SL. Accordingly, the second contact structure C2 and the shielding layer SL may include a metal material (for example, tungsten) having a high optical absorption rate. According to an embodiment, the second contact structure C2 and the shielding layer SL may be formed in one body (e.g., a unitary structure), but the embodiment is not limited thereto. Accordingly, according to an embodiment, the second contact structure C2 and the shielding layer SL may also include different materials from each other.

The pixel region R1 may include the first internal wiring IW1, and the pad region R2 may include the second contact structure C2 and the second internal wiring IW2.

The first internal wiring IW1 and the second internal wiring IW2 may be formed in the interlayer insulating layer 111. The first internal wiring IW1 may be electrically connected to the conductive layer 132 via a via formed inside the interlayer insulating layer 111. The second internal wiring IW2 may be electrically connected to the second contact structure C2. The second internal wiring IW2 may directly contact a lower surface of the second contact structure C2. The first internal wiring IW1 and the second internal wiring IW2 may be electrically connected to each other. The first internal wiring IW1 and the second internal wiring IW2 may include any one of doped silicon, a metal, metal silicide, a metal alloy, and a metal compound.

The first pad P1 may be arranged in the pad region R2. The first pad P1 may receive a bias from the bias generator to be described with reference to FIG. 20. The first pad P1 may be electrically connected to the shielding layer SL, and the shielding layer SL may be electrically connected to the first contact structure C1. Accordingly, the first pad P1 may transfer a first bias to the isolation region 143 via the shielding layer SL and the first contact structure C1.

When the shielding layer SL extends to the upper surface of the second contact structure C2, the shielding layer SL may be electrically connected to the second contact structure C2. The second contact structure C2 may be electrically connected to the second internal wiring IW2, the second internal wiring IW2 may be electrically connected to the first internal wiring IW1, and the first internal wiring IW1 may be electrically connected to the conductive layer 132. Accordingly, the first pad P1 may transfer the first bias to the conductive layer 132 via the shielding layer SL, the second contact structure C2, the second internal wiring IW2, and the first internal wiring IW1.

Figure 9A:
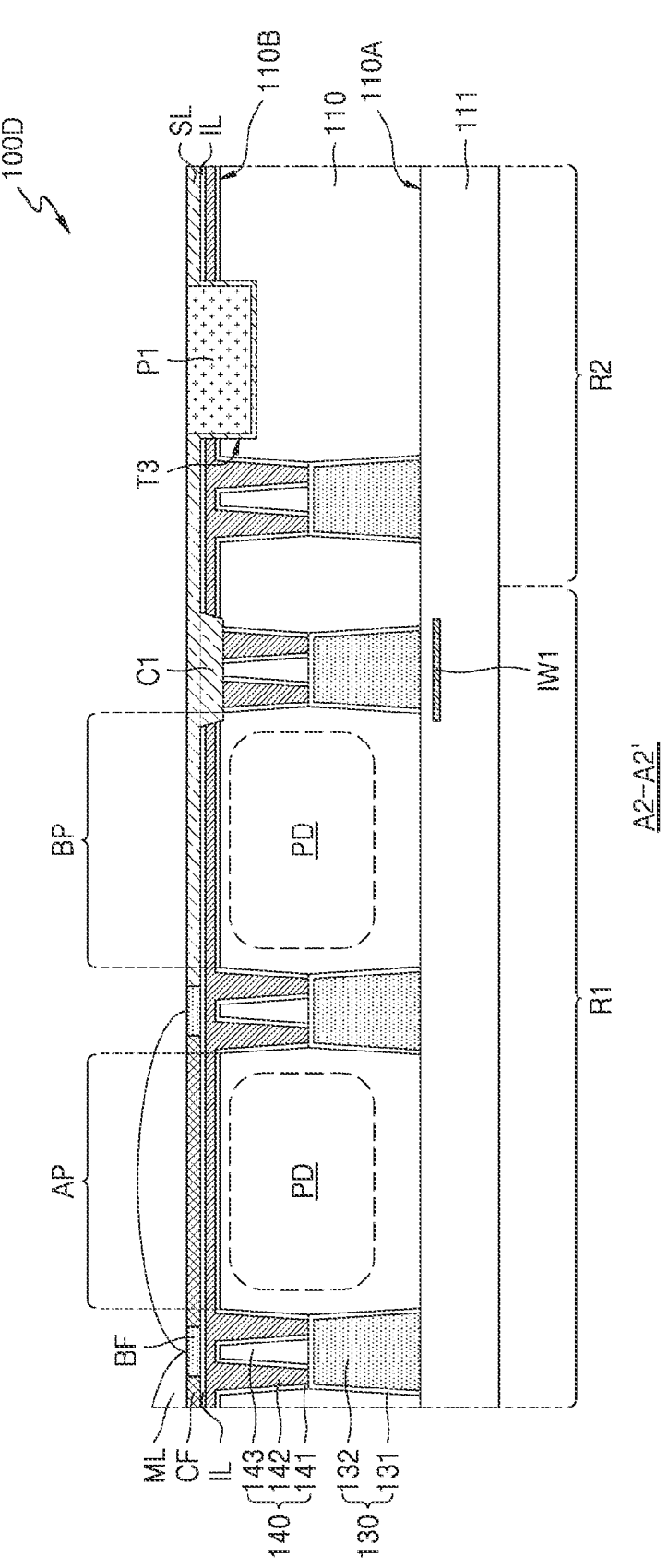
Figure 9B:
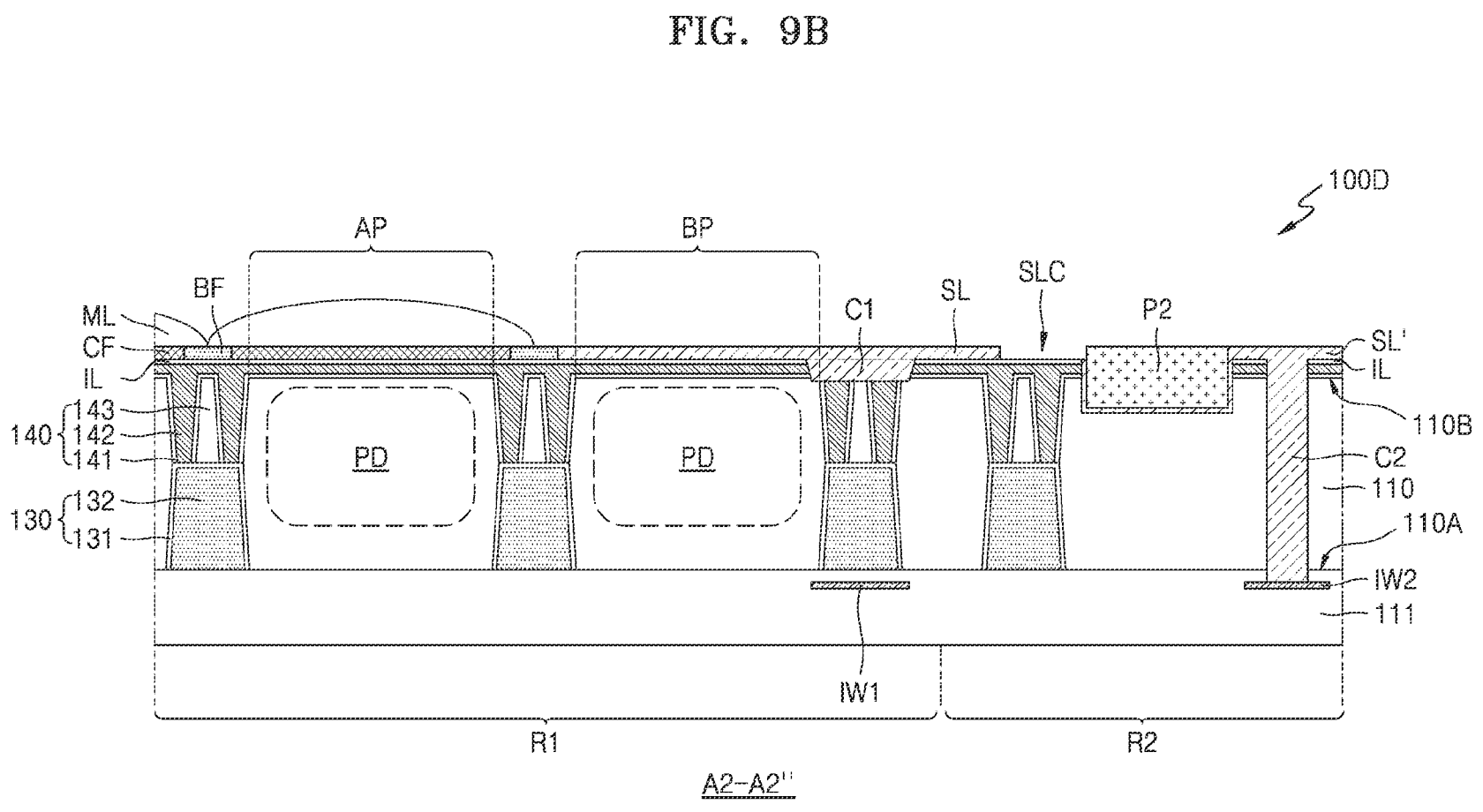

FIG. 9A is a cross-sectional view of an image sensor 100D taken along line A2-A2' in FIG. 1, according to an example embodiment of the inventive concept, and FIG. 9B is a cross-sectional view of the image sensor 100D taken along line A2-A2'' in FIG. 1, according to an example embodiment of the inventive concept. FIGS. 9A and 9B are diagrams for describing a structure in which the first bias and second bias are applied to the conductive layer 132 and the isolation region 143 in FIG. 6. Hereinafter, descriptions are given with reference to FIGS. 1, 6, and 8.

Referring to FIGS. 9A and 9B, the image sensor 100D may include the interlayer insulating layer 111, the active pixel AP, the optical black pixel BP, the first pad P1, a second pad P2, the first contact structure C1, the second contact structure C2, the shielding layer SL, a remaining shielding layer SL', a shielding layer cutting region SLC, the first internal wiring IW1, and the second internal wiring IW2.

The first pad P1 may receive the first bias. The first pad P1 may be electrically connected to the shielding layer SL, and the shielding layer SL may be electrically connected to the first contact structure C1. Accordingly, the first pad P1 may transfer the first bias to the isolation region 143 via the shielding layer SL and the first contact structure C1.

The second pad P2 may be arranged in the pad region R2. In an example embodiment, the second pad P2 may be arranged adjacent to the first pad P1 in FIG. 9A. For example, the second pad P2 may be a pad arranged at a location closest to the first pad P1 of a plurality of pads in the pad region R2 in FIG. 1, but is not limited thereto. According to an embodiment, the second pad P2 may also be arranged apart from the first pad P1 with one or more conductive pads therebetween.

The second pad P2 may include the same material as the first pad P1. For example, the second pad P2 may include at least one metal material of W, Al, Ti, Ru, Co, Ni, Cu, Au, Ag, and Pt. The second pad P2 and the shielding layer SL may include different materials from each other. For example, the second pad P2 may include aluminum, and the shielding layer SL may include tungsten. However, the embodiment is not limited thereto, and according to an embodiment, the second pad P2 and the shielding layer SL may include the same material as each other.

The shielding layer cutting region SLC may be formed in the pad region R2. The shielding layer cutting region SLC may also be formed in the pixel region R1, according to an embodiment. The remaining shielding layer SL', which is electrically blocked (e.g., electrically isolated) from the shielding layer SL in the pad region R2 by the shielding layer cutting region SLC, may be formed. The second pad P2 may be electrically connected to the remaining shielding layer SL' formed in the pad region R2, and may be electrically blocked (e.g., electrically isolated) from the shielding layer SL formed in the pixel region R1. Accordingly, an electrical connection of the first pad P1 to the second pad P2 may be blocked. Accordingly, the first bias applied to the first pad P1 may be transferred to the second pad P2.

A portion of the insulating layer IL may be exposed by the shielding layer cutting region SLC. A portion of side walls of the second pad P2 may be exposed by the shielding layer cutting region SLC, but is not limited thereto, and in another embodiment, the second pad P2 may have a shape surrounded by the remaining shielding layer SL'. The shielding layer SL and the remaining shielding layer SL' may include the same material, and the same thickness.

The second contact structure C2 may be arranged in the pad region R2. According to an embodiment, the second contact structure C2 may be arranged apart from the pixel region R1 with the second pad P2 therebetween, or may also be arranged between the first pad P1 and the pixel region R1. The second contact structure C2 may penetrate the semiconductor substrate 110 from the second surface 110B to the first surface 110A. The second contact structure C2 may extend into the interlayer insulating layer 111. Accordingly, the second contact structure C2 may extend from the second surface 110B of the semiconductor substrate 110 into the interlayer insulating layer 111.

The upper surface of the second contact structure C2 may be covered by the remaining shielding layer SL'. The second contact structure C2 may include the same material as the remaining shielding layer SL'. The second contact structure C2 and the remaining shielding layer SL' may include a metal material (for example) having a high optical absorption rate. According to an embodiment, the second contact structure C2 and the remaining shielding layer SL' may be formed in one body (e.g., a unitary structure), but the embodiment is not limited thereto.

The pixel region R1 may include the first internal wiring IW1 and the second internal wiring IW2. The first internal wiring IW1 and the second internal wiring IW2 may be formed in the interlayer insulating layer 111. The first internal wiring IW1 may be electrically connected to the conductive layer 132 via a via formed inside the interlayer insulating layer 111.

The second internal wiring IW2 may be electrically connected to the second contact structure C2. The second internal wiring IW2 may directly contact the lower surface of the second contact structure C2. The first internal wiring IW1 and the second internal wiring IW2 may be electrically connected to each other. The first internal wiring IW1 and the second internal wiring IW2 may include any one of doped silicon, a metal, metal silicide, a metal alloy, and a metal compound.

The second pad P2 may receive the second bias. A voltage level of the second bias may be different from a voltage level of the first bias. According to an embodiment, the voltage level of the second bias may the same as the voltage level of the first bias.

The second pad P2 may be electrically connected to the remaining shielding layer SL', and the remaining shielding layer SL' may be electrically connected to the second contact structure C2. The second contact structure C2 may be electrically connected to the second internal wiring IW2, the second internal wiring IW2 may be electrically connected to the first internal wiring IW1, and the first internal wiring IW1 may be electrically connected to the conductive layer 132. Accordingly, the second pad P2 may transfer the second bias to the conductive layer 132 via the remaining shielding layer SL', the second contact structure C2, the second internal wiring IW2, and the first internal wiring IW1.

Figure 10:
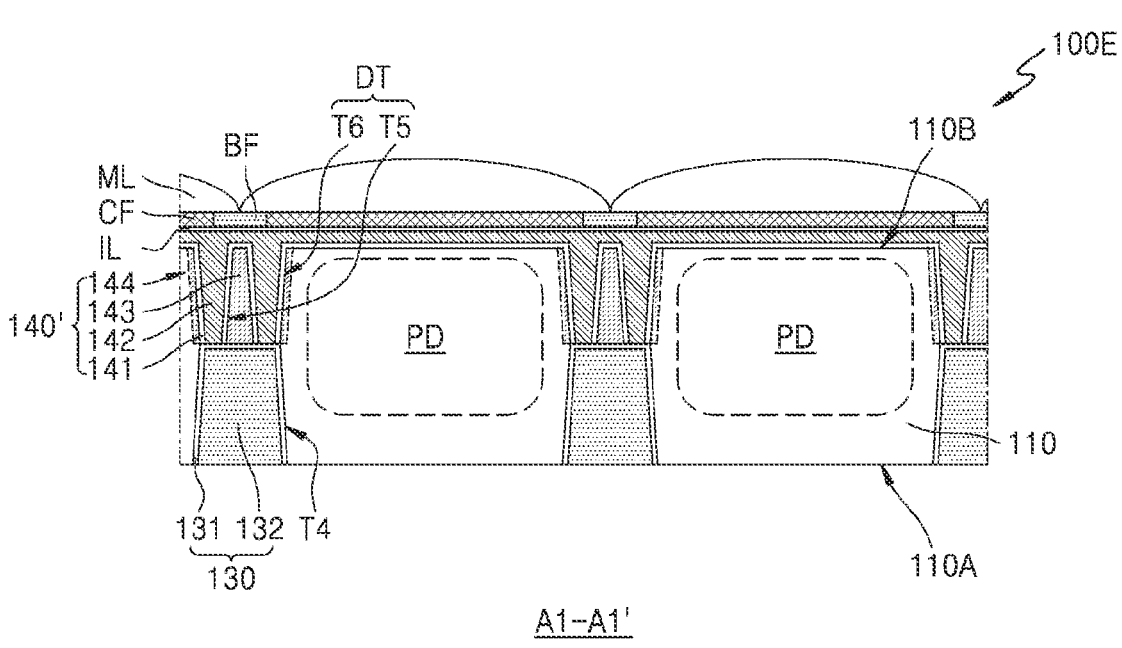
FIG. 10 is a cross-sectional view of an image sensor according to an example embodiment of the inventive concept.

FIG. 10 is a cross-sectional view of an image sensor 100E according to an example embodiment of the inventive concept. FIG. 10 is a cross-sectional view of the image sensor 100E taken along line A1-A1' in FIG. 1, according to an example embodiment, and duplicate descriptions of the image sensor 100C of FIG. 6 are omitted. Hereinafter, descriptions are given with reference to FIGS. 1 and 6.

Referring to FIG. 10, the image sensor 100E may include the semiconductor substrate 110, the photoelectric conversion region PD, the first pixel isolation structure 130, a second pixel isolation structure 140', the insulating layer IL, the color filter CF, the color filter boundary fence BF, and the micro lens ML.

The second pixel isolation structure 140' may include an insulating liner 141, the dielectric layer 142, the isolation region 143, and an impurity region 144. The impurity region 144 may be arranged around the double trench DT in the semiconductor substrate 110, and may be a region doped with impurities. The impurity region 144 may have a shape surrounding the double trench DT. The impurity region 144 may partially overlap the isolation region 143. In other words, the isolation region 143 may be formed in a portion of the impurity region 144. The impurity region 144 may not overlap the photoelectric conversion region PD.

The impurity region 144 may include a region where impurities is doped. Impurities may include Group III elements (for example, boron), but is not limited thereto. In another embodiment, impurities may include Group V elements.

Because the second pixel isolation structure 140' includes the impurity region 144, the bias applied to the isolation region 143 may be transferred faster to the entire pixel region R1, and dark current due to defects on a surface of the double trench DT may be reduced.

Figure 11:
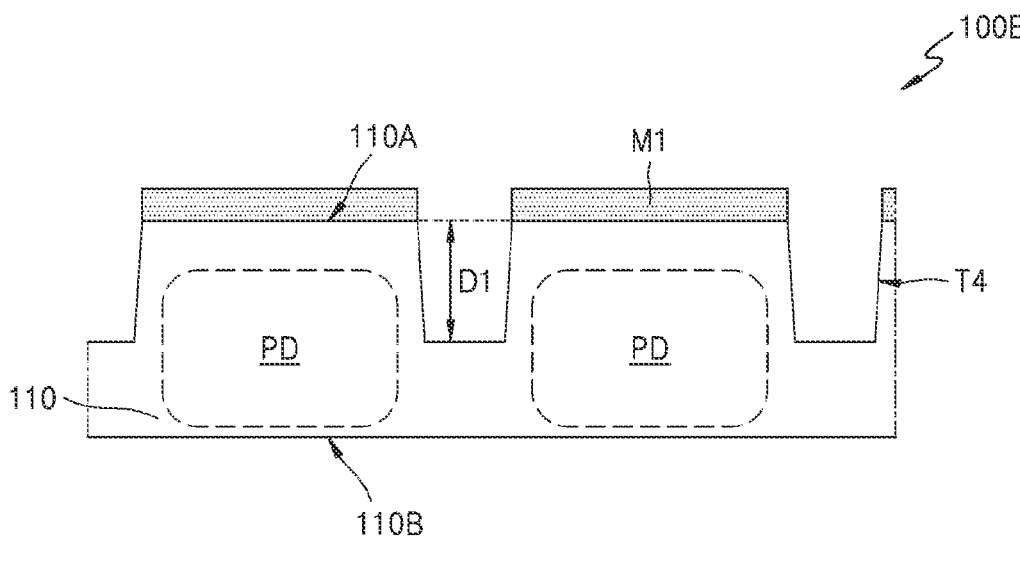
FIGS. 11 through 17 are cross-sectional views illustrating a manufacturing method of an image sensor, according to example embodiments of the inventive concept.
Figure 17:
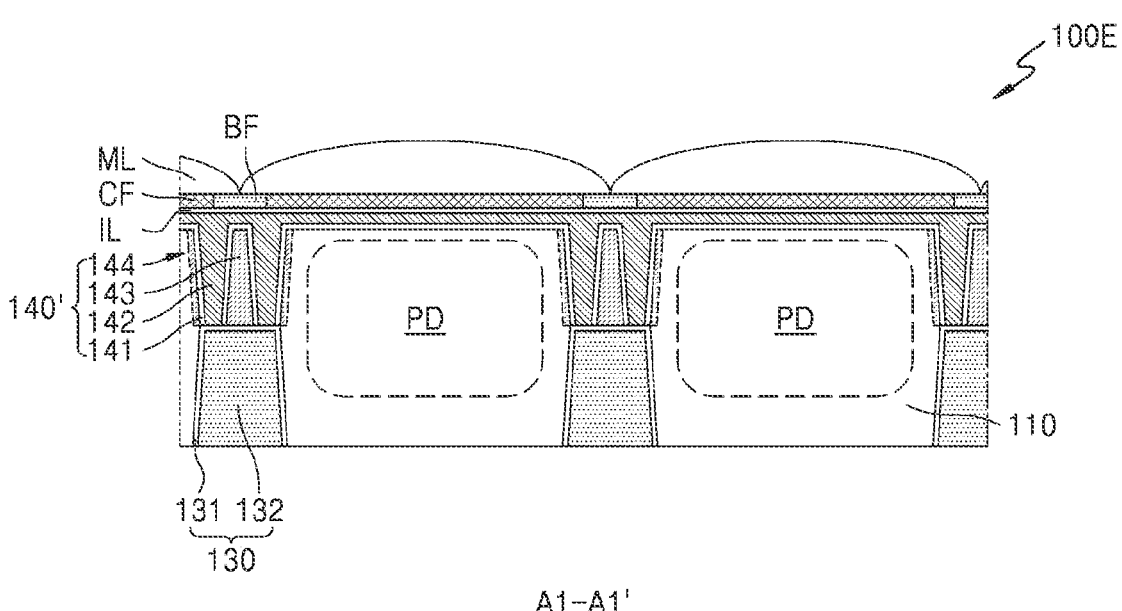

FIGS. 11 and 17 are cross-sectional views illustrating a manufacturing method of the image sensor 100E, according to example embodiments. Hereinafter, descriptions are given with reference to FIGS. 1 through 10.

Referring to FIG. 11, the semiconductor substrate 110 including the first surface 110A and the second surface 110B opposite each other may be prepared. When impurities is doped on the first surface 110A of the semiconductor substrate 110, the photoelectric conversion region PD may be formed. Impurities may include Group V elements.

Subsequently, after a first mask pattern M1 is formed on the first surface 110A, the fourth trench T4 may be formed in the semiconductor substrate 110 by using the first mask pattern M1 as an etch mask. The first mask pattern M1 may cover the photoelectric conversion region PD. In other words, the first mask pattern M1 may have a planar shape corresponding to a planar shape of the plurality of pixels PX in the pixel region R1 in FIG. 1. The first mask pattern M1 may expose a portion corresponding to a region of the pixel isolation structure DTI in FIG. 1.

The fourth trench T4 may be formed in a direction perpendicular to the first surface 110A. A depth D1 of the fourth trench T4 may variously formed according to an embodiment. The depth D1 of the fourth trench T4 may be set as a depth at which optical crosstalk and electrical crosstalk between adjacent pixels are optimized.

A process for forming the fourth trench T4 may include a Bosch process. In other words, the fourth trench T4 may be formed by repeating several times an inductive coupled plasma (ICP) deep reactive ion etching (DRIE) process using $SF_6$ or $O_2$ plasma and a side wall passivation process using any one of CFx-based gas such as $C_4F_8$.

Figure 12:
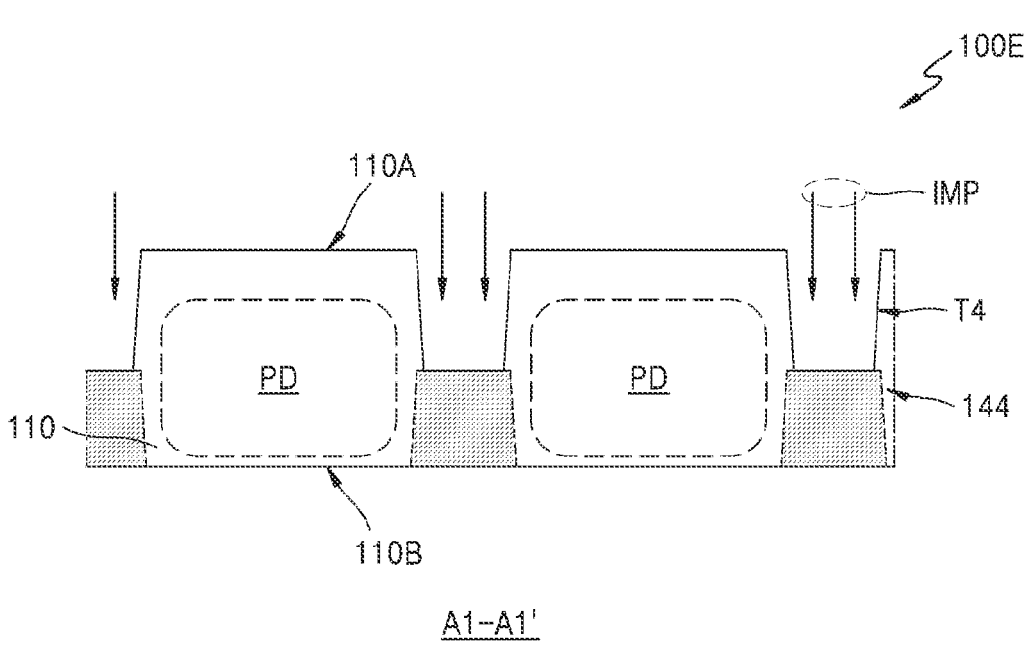

Referring to FIG. 12, impurities may be injected into the fourth trench T4 by using an ion implantation process (IMP). Impurities may include Group III ions (for example, boron). By performing the IMP, a barrier impurity region 144 may be formed in the semiconductor substrate 110. The first mask pattern M1 may be removed after the IMP.

Figure 13:
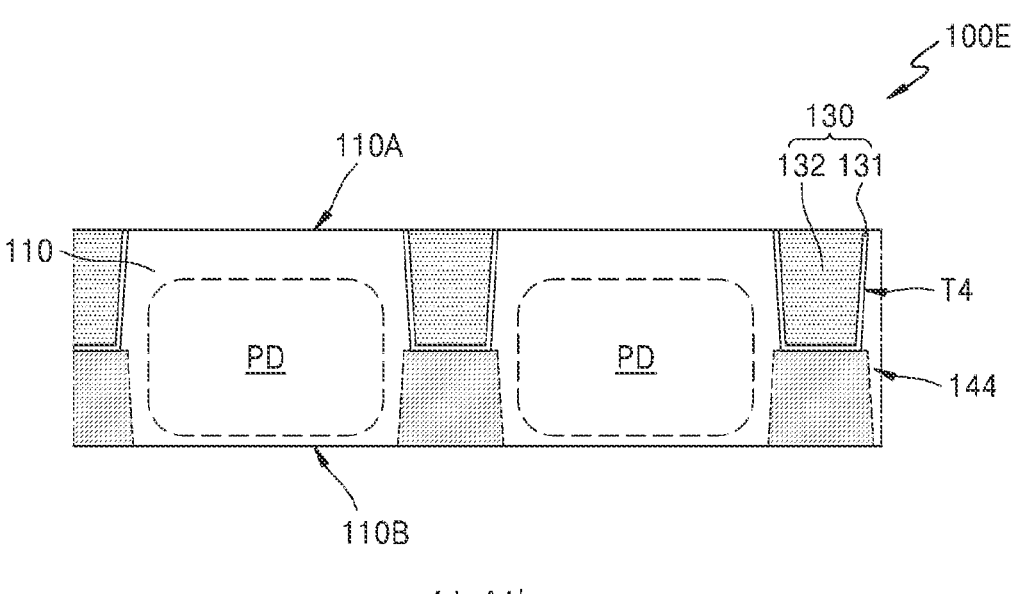

Referring to FIG. 13, the first insulating liner 131 may be formed on an exposed surface of the fourth trench T4. The conductive layer 132 filling the internal space of the fourth trench T4 may be formed on the first insulating liner 131.

Subsequently, a planarization process may be performed so that a level of an upper surface of the conductive layer 132 is the same as a level of the first surface 110A. The first insulating liner 131 and the conductive layer 132 may constitute the first pixel isolation structure 130.

Figure 14:
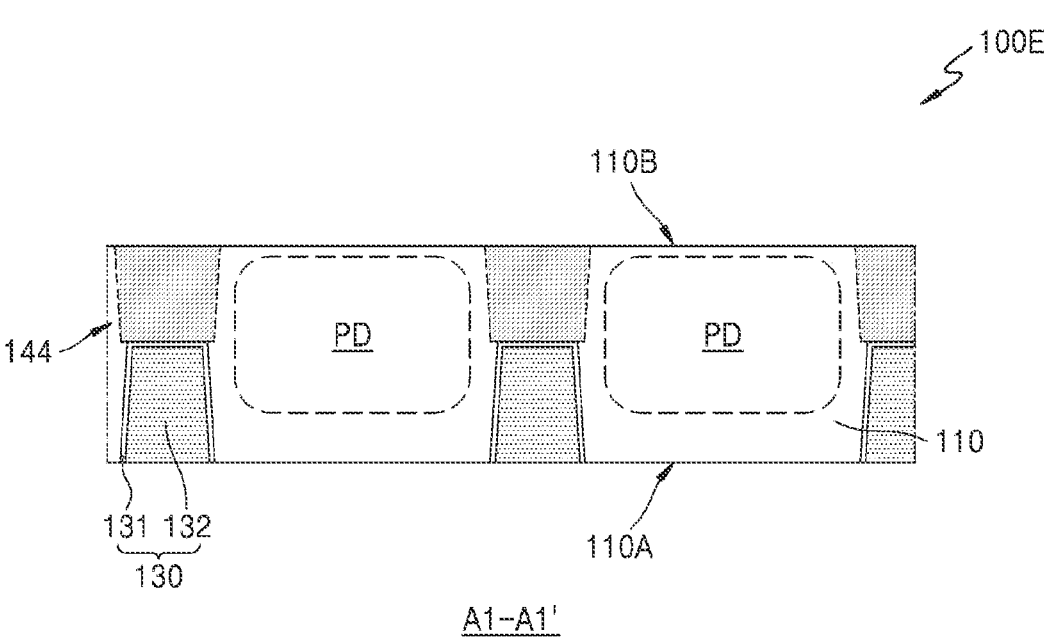

Referring to FIG. 14, the first surface 110A and the second surface 110B may be turned over. Accordingly, an upper surface of the first surface 110A may be arranged at a lowest level of the semiconductor substrate 110.

Figure 15:
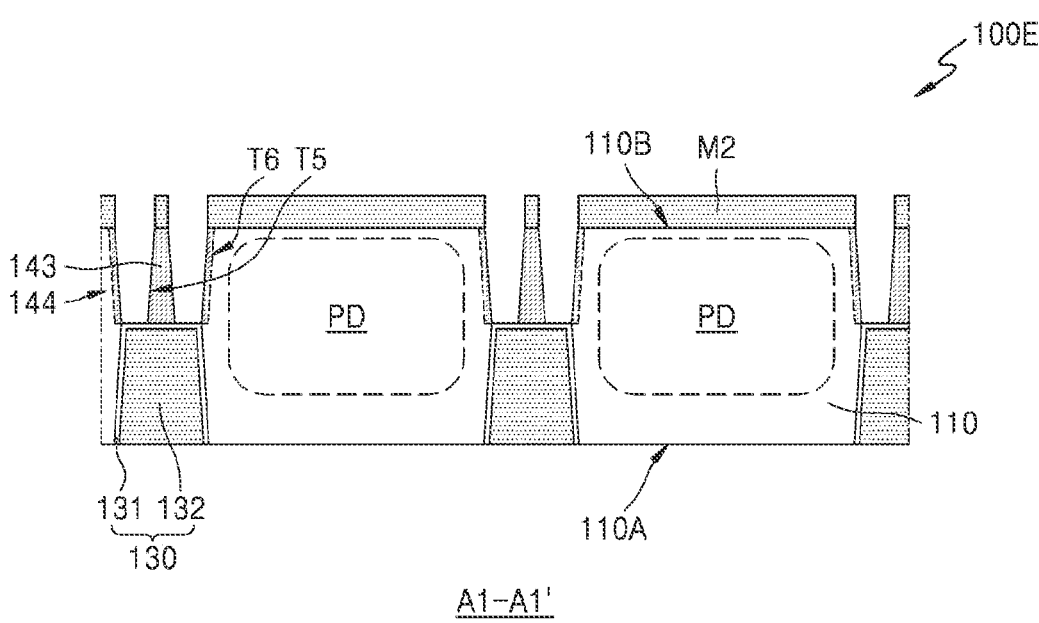

Referring to FIG. 15, after a second mask pattern M2 is formed on the second surface 110B, the fifth trench T5 and the sixth trench T6 may be formed in the semiconductor substrate 110 by using the second mask pattern M2 as an etch mask.

The fifth trench T5 and the sixth trench T6 may be formed in a direction perpendicular to the second surface 110B. The depth of the fifth trench T5 and the sixth trench T6 may be variously formed according to an embodiment. For example, the fifth trench T5 and the sixth trench T6 may be etched until the first insulating liner 131 is exposed. Alternatively, the fifth trench T5 and the sixth trench T6 may be etched until a portion of the first insulating liner 131 is etched. Shapes of the fifth trench T5 and the sixth trench T6 may not be limited thereto, and in another embodiment, a greatest width measured between the fifth trench T5 and the sixth trench T6 may be greater than the least width of the conductive layer 132. In this case, the fifth trench T5 and the sixth trench T6 may be etched until the side walls of the first pixel isolation structure 130 are exposed.

The depth of the fifth trench T5 and the sixth trench T6 may be set at a depth at which optical crosstalk and electrical crosstalk between adjacent pixels are optimized. A process for forming the fifth trench T5 and the sixth trench T6 may include the Bosch process.

When the fifth trench T5 and the sixth trench T6 are formed, the isolation region 143 may be defined between the fifth trench T5 and the sixth trench T6. The isolation region 143 may be isolated from the photoelectric conversion region PD by the fourth through sixth trenches T4 through T6. The isolation region 143 may be formed in a portion of the impurity region 144. After the fifth trench T5 and the sixth trench T6 are formed, the second mask pattern M2 may be removed.

Figure 16:
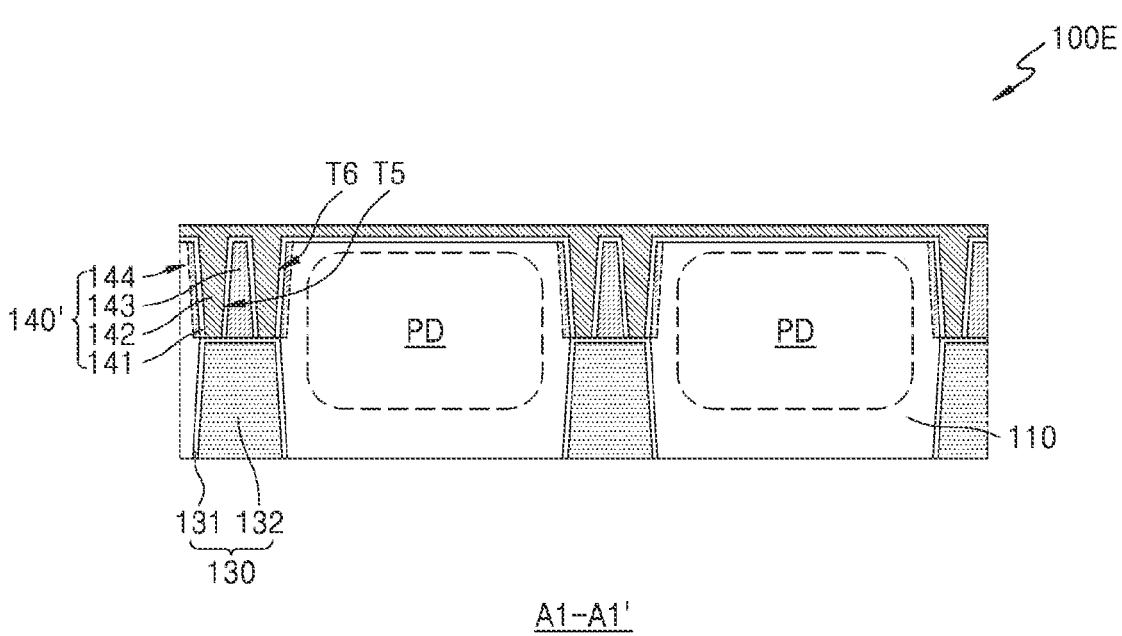

Referring to FIG. 16, the second insulating liner 141 may be formed on the exposed surfaces of the fifth trench T5 and the sixth trench T6. In addition, the second insulating liner 141 may be formed on an upper surface of the second surface 110B. Accordingly, in a top view, the second insulating liner 141 may be formed on the entire exposed surface of the semiconductor substrate 110.

Subsequently, the dielectric layer 142 may be formed on the second insulating liner 141. The dielectric layer 142 may fill the internal space of the fifth trench T5 and the sixth trench T6, and may cover the second insulating liner 141 formed on the second surface 110B. Accordingly, in a top view, the dielectric layer 142 may be formed on the entire exposed surface of the semiconductor substrate 110.

The second insulating liner 141, the dielectric layer 142, the isolation region 143, and the impurity region 144 may constitute the second pixel isolation structure 140.

Referring to FIG. 17, the insulating layer IL may be formed on the dielectric layer 142. The color filter CF may be formed on the insulating layer IL, and the color filter boundary fence BF may be formed between the color filters CF. A height of the color filter CF may be the same as a height of the color filter boundary fence BF. The micro lens ML may be formed on the color filter CF and the color filter boundary fence BF.

Figure 18:
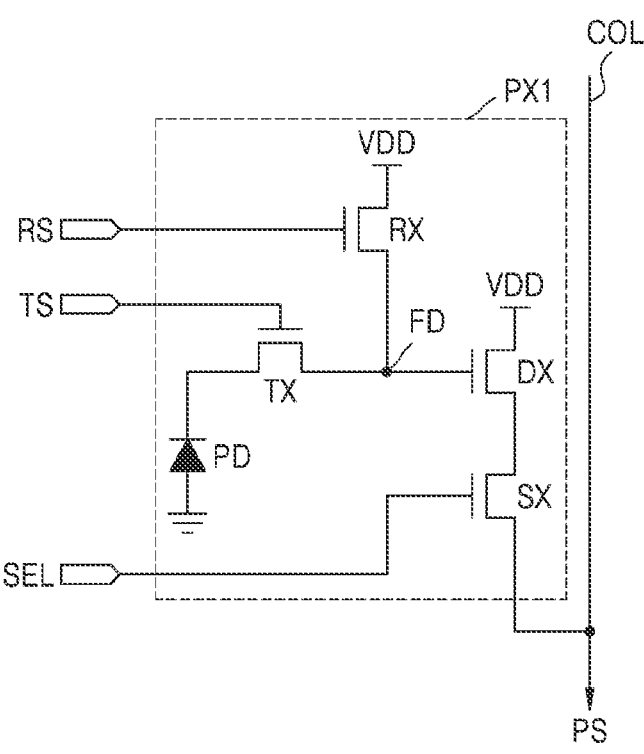
FIG. 18 is an equivalent circuit diagram of a pixel of an image sensor, according to an example embodiment of the inventive concept.

FIG. 18 is a circuit diagram of a pixel, according to an embodiment. FIG. 18 is a diagram for describing anyone pixel PX1 of the plurality of pixels PX.

Referring to FIG. 18, the pixel PX1 may include the photoelectric conversion region PD, a transmit transistor TX, a floating diffusion node FD, a reset transistor RX, a driving transistor DX, and a select transistor SX. However, the inventive concept may be not limited thereto, and the photoelectric conversion region PD may be replaced by another photoelectric conversion element.

Each of a reset control signal RS provided to a gate electrode of the reset transistor RX, a transmit control signal TS provided to a gate electrode of the transmit transistor TX, and a select control signal SEL provided to a gate electrode of the select transistor SX may be provided by a row driver (refer to 320 in FIG. 20) according to a control signal generated by a controller (refer to 340 in FIG. 20) to be described later.

The photoelectric conversion region PD may generate photocharges varying according to intensity of incident light. For example, the photoelectric conversion region PD may, as a p-n junction diode, generate charges, that is, electrons of negative charge and holes of positive charges, in proportion to incident light amount. The photoelectric conversion region PD, as an example of a photoelectric conversion element, may include at least one of a photo transistor, a photo gate, a pinned photo diode (PPD), or a combination thereof.

The floating diffusion node FD (or referred to as a floating diffusion region) may be formed between the transmit transistor TX, the reset transistor RX, and the driving transistor DX. The transmit transistor TX may transmit the photocharges to the floating diffusion node FD according to the transmit control signal TS. According to an example embodiment, the floating diffusion node FD may operate as a capacitor. When the transmit transistor TX is turned on in response to the transmit control signal TS applied to the gate terminal of the transmit transistor TX, charges (for example, photocharges) generated in the photoelectric conversion region PD may be transferred to and may be stored in the floating diffusion node FD.

The driving transistor DX may amplify photocharges according to electrical potential corresponding to an amount of photocharges stored in the floating diffusion node FD, and may transmit the amplified photocharges to the select transistor SX. A drain electrode of the select transistor SX may be connected to a source of the driving transistor DX, and may output a pixel signal to a column line COL connected to the pixel PX1 according to the select signal SEL. The reset transistor RX may reset the floating diffusion node FD to a level of a power voltage VDD according to a reset control signal RS.

The reset transistor RX may periodically reset the charges accumulated in the floating diffusion node FD. A source electrode of the reset transistor RX may be connected to the floating diffusion node FD, and a drain electrode of the reset transistor RX may be connected to the power voltage VDD. When the reset transistor RX is turned on in response to the reset control signal RS applied to a gate electrode thereof, the power voltage VDD applied to a drain electrode thereof may be transferred to the floating diffusion node FD. When the reset transistor RX is turned on, charges accumulated in the floating diffusion node FD may be released and the floating diffusion node FD may be reset.

The driving transistor DX may operate as a source follower. The driving transistor DX may receive charges of the floating diffusion node FD, that is, a signal according to an electrical potential of the floating diffusion node FD, at the gate electrode thereof, and may buffer and output the received signal. The select transistor SX may be turned on in response to the select signal SEL applied to the gate electrode thereof, and when the select transistor SX is turned on, the buffered signal output by the driving transistor DX may be output as the pixel signal PS via the column line COL.

In FIG. 18, the pixel PX1 is illustrated in a 4-transistor (4T) structure including one photoelectric conversion region PD, and four transistors TX, RX, DX, and SX, but each of the plurality of pixels PX1 according to the inventive concept may not be limited to the structure in FIG. 18.

Figure 19:
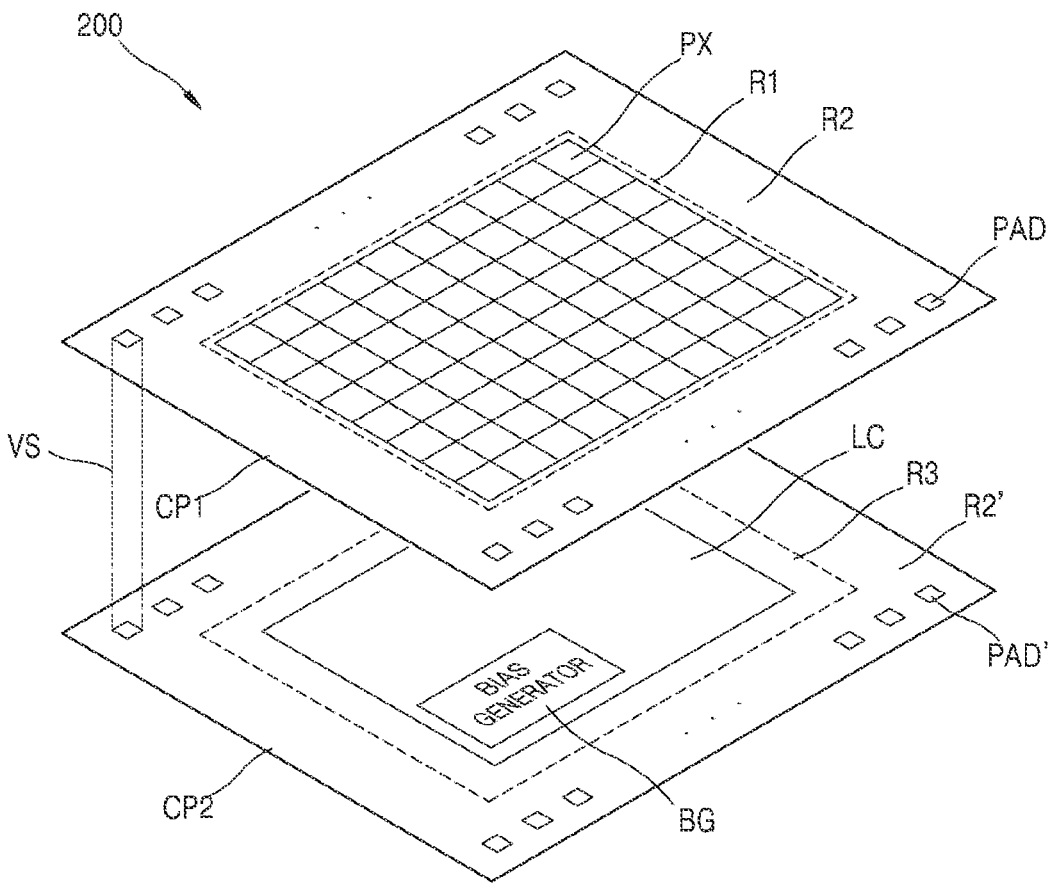
FIG. 19 is a schematic diagram of an image sensor according to an example embodiment of the inventive concept.

FIG. 19 is a schematic diagram of an image sensor 200 according to an example embodiment of the inventive concept. FIG. 19 is a diagram for describing the image sensor 200 including the image sensor 100 of FIG. 1, and descriptions of the image sensor 200 is given with reference to FIG. 1.

Referring to FIG. 19, the image sensor 200 may include a stack-type image sensor including a first chip CP1 and a second chip CP2, which are stacked in the vertical direction. The image sensor 200 may include at least one of the image sensors 100A through 100E described with reference to FIGS. 1 through 10.

The first chip CP1 may include the pixel region R1 and the pad region R2, and the second chip CP2 may include a periphery circuit region R3 and a lower pad region R2'. The pixel region R1 and the pad region R2 of the first chip CP1 may correspond to the pixel region R1 and the pad region R2 in FIG. 1, respectively.

The periphery circuit region R3 of the second chip CP2 may include a logic circuit block LC, and may include a plurality of transistors. The periphery circuit region R3 may provide a certain signal to each of the plurality of pixels PX included in the pixel region R1, and may control an output signal of each of the plurality of pixels PX.

The periphery circuit region R3 may include the bias generator BG. The bias generator BG may apply a bias to the pixel region R1. For example, the bias generator BG may provide a negative bias to a pixel isolation structure included in the pixel region R1.

The lower pad region R2' of the second chip CP2 may include a lower conductive pad PAD'. The lower conductive pad PAD' may be in a plurality, and the lower conductive pads PAD' may correspond to the conductive pads PAD, respectively. The lower conductive pad PAD' may be electrically connected to the conductive pad PAD of the first chip CP1 via a via structure VS.

Figure 20:
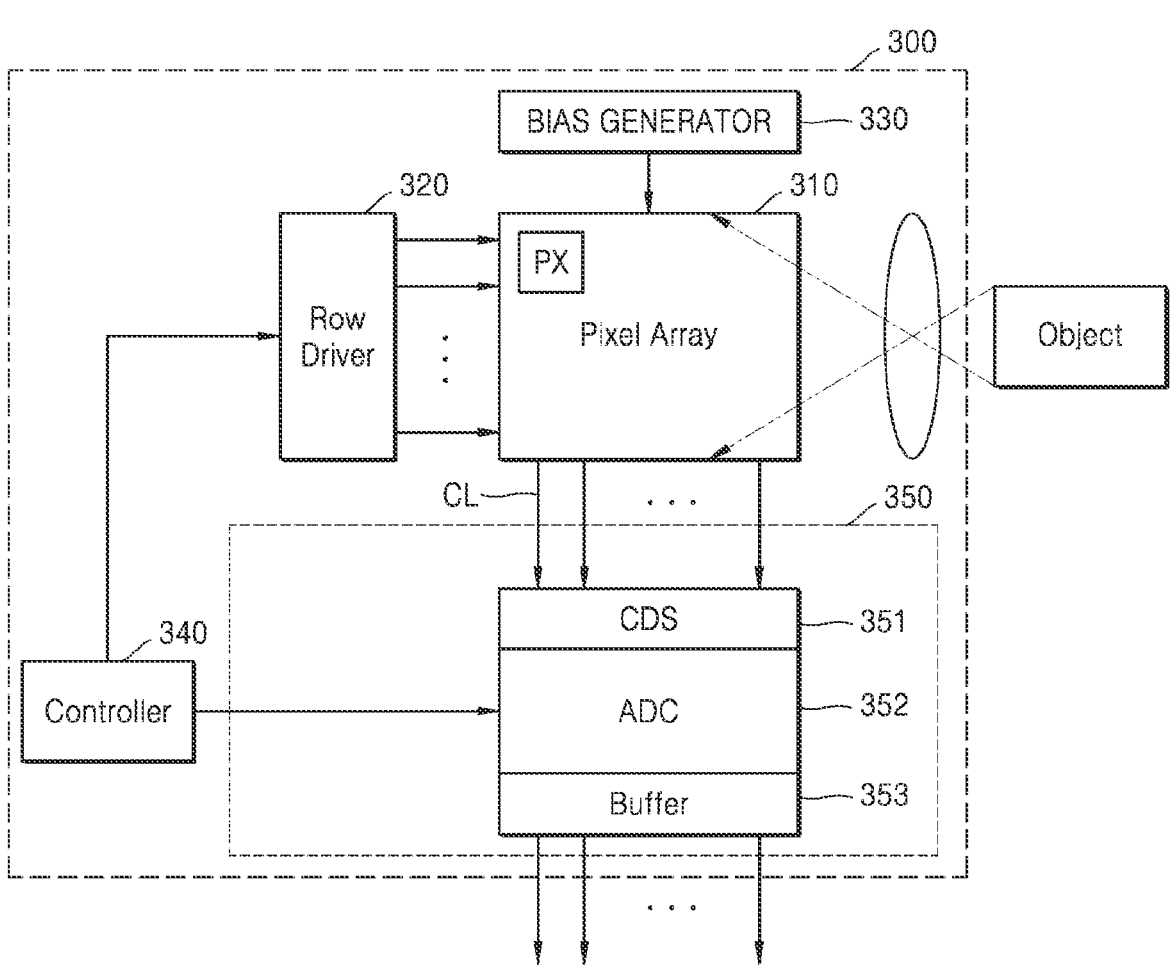
FIG. 20 is a block diagram of an image sensor according to an example embodiment of the inventive concept.

FIG. 20 is a block diagram illustrating a configuration of an image sensor 300, according to an embodiment.

Referring to FIG. 20, the image sensor 300 may include a pixel array 310, a row driver 320, a bias generator 330, a controller 340, and a pixel signal processor 350. The image sensor 300 may include at least one of the image sensors 100A through 100E described with reference to FIGS. 1 through 10. Each component of the image sensor 300 is provided only as an example, and at least some components may be added or omitted as necessary.

The pixel array 310 may include the plurality of pixels PX arranged in a two-dimensional matrix form constituted by a plurality of rows and a plurality of columns. The plurality of pixels PX may convert an incident optical signal into an electrical signal. The pixel array 310 may receive a pixel control signal from the row driver 320, and may be driven by the pixel control signal.

The row driver 320 may drive the pixel array 310 according to a control of the controller 340. The row driver 320 may generate a row select signal for selecting one row of the plurality of rows of the pixel array 310. The row driver 320 may sequentially enable a pixel reset signal and a transmission signal for the pixels corresponding to the selected row. Accordingly, the pixel signal of an analog type generated by each of the pixels of the selected row may be sequentially output.

The bias generator 330 may generate bias according to the control of the controller 340. The bias generator 330 may apply a bias to each of pixels PX included in the pixel array 310. The bias generator 330 may provide a bias to the pixel isolation structure included in the pixel array 310, for controlling dark current occurring in the pixel array 310. The bias generator 330 may also directly apply a bias to the pixel array 310, or may also apply a bias to the pixel array 310 via the row driver 320. According to an embodiment, the bias generator 330 may include the row driver 320.

The controller 340 may transmit various control signals to the row driver 320 and the pixel signal processor 350. The control signal may include a signal controlling the pixel array 310.

The pixel signal processor 350 may receive a pixel signal generated by the pixel array 310 via the column line CL. The pixel signal processor 350 may include a correlated double sampler (CDS) 351, an analog-to-digital converter (ADC) 352, and an output buffer 353.

The CDS 351 may sample and hold the pixel signal provided by the pixel array 310, according to the control of the controller 340.

The ADC 352 may convert an analog signal output by the CDS 351 into a digital signal, and output the digital signal. When a counting operation and a computation operation are performed based on the analog signal output by the CDS 351 and a ramp signal provided by the controller 340, the ADC 352 may generate image data of a digital form in which noise corresponding to each column (for example, unique rest noise of each pixel) is removed.

The output buffer 353 may capture image data in column units provided by the ADC 352, and output the captured image data. The output buffer 353 may temporarily store the image data output by the ADC 352 according to the control of the controller 340. The output buffer 353 may operate as an interface compensating for a transmission (or process) speed between the image sensor 300 and another device connected thereto.

While the inventive concept has been particularly shown and described with reference to embodiments thereof, it will be understood that various changes in form and details may be made therein without departing from the scope of the following claims.

What is claimed is:

1. An image sensor comprising:
a semiconductor substrate comprising a first surface and a second surface that is opposite the first surface and comprising a plurality of pixels;
a first pixel isolation structure comprising a first trench recessed from the first surface of the semiconductor substrate into the semiconductor substrate and a conductive layer in the first trench; and
a second pixel isolation structure comprising a second trench and a third trench each recessed from the second surface of the semiconductor substrate into the semiconductor substrate and a dielectric layer in the second trench and the third trench,
wherein the first pixel isolation structure and the second pixel isolation structure contact each other and separate the plurality of pixels from each other,
wherein the second trench and the third trench are disposed between a first pixel of the plurality of pixels and a second pixel of the plurality of pixels that is adjacent to the first pixel, and
wherein a first height of the first pixel isolation structure and a second height of the second pixel isolation structure are each less than a thickness of the semiconductor substrate, the first height corresponding to a length of the first pixel isolation structure in a direction perpendicular to the first surface, the second height corresponding to a length of the second pixel isolation structure in a direction perpendicular to the second surface, and the thickness corresponding to a distance between the first surface and the second surface.

2. The image sensor of claim 1, wherein the plurality of pixels comprise photoelectric conversion regions,
wherein the second pixel isolation structure further comprises an isolation region between the second trench and the third trench,
wherein the second trench is between the isolation region and the photoelectric conversion region of the first pixel,
wherein the third trench is between the isolation region and the photoelectric conversion region of the second pixel, and
wherein the isolation region is configured to have a first bias applied thereto.

3. The image sensor of claim 2, wherein the conductive layer of the first pixel isolation structure is configured to have a second bias applied thereto.

4. The image sensor of claim 3, wherein a voltage level of the first bias is identical to that of the second bias.

5. The image sensor of claim 1, further comprising a micro lens on the second surface of the semiconductor substrate.

6. The image sensor of claim 1, wherein, in a region where the first pixel isolation structure and the second pixel isolation structure contact each other, a width of the first trench is greater than a width of the second trench.

7. The image sensor of claim 1, wherein, in a region where the first pixel isolation structure and the second pixel isolation structure contact each other, a width of the first trench is greater than a sum of a width of the second trench and a width of the third trench.

8. The image sensor of claim 1, wherein the second pixel isolation structure further comprises an isolation region between the second trench and the third trench, and one of the second trench and the third trench is between the isolation region and photoelectric conversion regions of the plurality of pixels, and
the isolation region and the conductive layer comprise different materials from each other.

9. The image sensor of claim 1, wherein the second pixel isolation structure further comprises a barrier impurity region including impurities, and at least portions of the second trench and the third trench are in the barrier impurity region.

10. An image sensor comprising:
a semiconductor substrate comprising a first surface and a second surface opposite the first surface and comprising a plurality of photoelectric conversion regions;
a micro lens on the second surface of the semiconductor substrate; and
a pixel isolation structure separating the plurality of photoelectric conversion regions from each other,
wherein the pixel isolation structure comprises:
a first trench recessed from the second surface of the semiconductor substrate into the semiconductor substrate;
a second trench recessed from the second surface into the semiconductor substrate; and
an isolation region that is between the first trench and the second trench and is configured to receive a bias via a contact structure that is in contact with the pixel isolation structure,
wherein the first trench and the second trench are disposed between a first photoelectric conversion region of the plurality of photoelectric conversion regions and a second photoelectric conversion region of the plurality of photoelectric conversion regions that is adjacent to the first photoelectric conversion region.

11. The image sensor of claim 10, wherein the pixel isolation structure further comprises a barrier impurity region including impurities, and at least portions of the first trench and the second trench are in the barrier impurity region.

12. The image sensor of claim 10, wherein the bias is a negative dark current suppression bias.

13. The image sensor of claim 10, wherein the first trench and the second trench are formed to penetrate the semiconductor substrate from the second surface to the first surface of the semiconductor substrate.

14. An image sensor comprising:

a pixel array comprising a plurality of pixels on a semiconductor substrate;

a bias generator configured to supply a bias to the pixel array; and a plurality of conductive pads configured to apply the bias received from the bias generator to the pixel array, wherein the pixel array comprises:

a first pixel isolation structure comprising a first trench recessed from a first surface of the semiconductor substrate into the semiconductor substrate to a first contact surface and a conductive layer in the first trench; and a second pixel isolation structure comprising a second trench and a third trench recessed from a second surface of the semiconductor substrate into the semiconductor substrate to a second contact surface and a third contact surface, respectively, a dielectric layer in the second trench and the third trench, and an isolation region between the second trench and the third trench, wherein the second surface of the semiconductor substrate is opposite the first surface of the semiconductor substrate, wherein the first contact surface of the first pixel isolation structure contacts the second contact surface and the third contact surface of the second pixel isolation structure and wherein the first pixel isolation structure and the second pixel isolation structure separate the plurality of pixels from each other, and the bias generator is configured to apply a first negative bias to the isolation region via a first pad of the plurality of conductive pads.

15. The image sensor of claim 14, wherein the bias generator is configured to apply the first negative bias to the conductive layer via the first pad.

16. The image sensor of claim 14, wherein the bias generator is configured to apply a second bias having a different voltage level from the first negative bias to the conductive layer via a second pad that is different from the first pad of the plurality of conductive pads.

17. The image sensor of claim 14, wherein, in a region where the first pixel isolation structure and the second pixel isolation structure contact each other, a width of the first trench is greater than a width of the second trench.

18. The image sensor of claim 14, wherein the first trench and the second trench have different depths from each other in the semiconductor substrate.

19. The image sensor of claim 14, wherein the isolation region and the conductive layer comprise different materials from each other.

20. The image sensor of claim 14, wherein the second pixel isolation structure further comprises a barrier impurity region including impurities, and at least portions of the second trench and the third trench are in the barrier impurity region.

* * * * *